United States Patent
Modi et al.

(10) Patent No.: US 9,905,724 B2
(45) Date of Patent: Feb. 27, 2018

(54) OPTICAL MATERIALS, OPTICAL COMPONENTS, AND METHODS

(71) Applicant: SAMSUNG ELECTRONICS CO., LTD., Suwon-si (KR)

(72) Inventors: Rohit Modi, Freemont, CA (US); Patrick Landreman, Stanford, CA (US); John R. Linton, Concord, MA (US); Emily M. Squires, Littleton, MA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/853,263

(22) Filed: Sep. 14, 2015

(65) Prior Publication Data

US 2016/0072005 A1     Mar. 10, 2016

Related U.S. Application Data

(63) Continuation of application No. 13/283,382, filed on Oct. 27, 2011, now Pat. No. 9,133,388, which is a
(Continued)

(51) Int. Cl.
*H01L 21/00* (2006.01)
*H01L 33/00* (2010.01)
(Continued)

(52) U.S. Cl.
CPC .......... *H01L 33/005* (2013.01); *B82Y 10/00* (2013.01); *C09K 11/02* (2013.01); *H01L 33/06* (2013.01);
(Continued)

(58) Field of Classification Search
CPC ......... H01L 33/20; H01L 33/06; H01L 33/22; H01L 33/05; H01L 44/105; C09K 11/02;
(Continued)

(56) References Cited

U.S. PATENT DOCUMENTS 4,075,037 A    2/1978  Tarneja et al.
4,201,598 A    5/1980  Tanaka et al.
(Continued)

FOREIGN PATENT DOCUMENTS

CN    1629716 A    6/2005
EP    2040514      3/2009
(Continued)

OTHER PUBLICATIONS

Notice of Allowance dated Apr. 5, 2017 of the corresponding Korean Patent Application No. 10-2011-7028142.
(Continued)

*Primary Examiner* — Thinh T Nguyen
(74) *Attorney, Agent, or Firm* — Cantor Colburn LLP

(57) ABSTRACT

An optical material comprising quantum confined semiconductor nanoparticles, wherein at least a portion of the nanoparticles are in a charge neutral state is disclosed. Also disclosed is an optical component including an optical material comprising quantum confined semiconductor nanoparticles, wherein at least a portion of the nanoparticles are in a charge neutral state. Further disclosed is an optical material obtainable by at least partially encapsulating an optical material comprising quantum confined semiconductor nanoparticles and irradiating the at least partially encapsulated optical material with a light flux for a period of time sufficient to neutralize the charge on at least a portion of the nanoparticles. Further enclosed is an optical component obtainable by at least partially encapsulating an optical component including an optical material comprising quantum confined semiconductor nanoparticles and irradiating the at least partially encapsulated optical material with a light flux for a period of time sufficient to neutralize the charge on at least a portion of the nanoparticles. Methods are also disclosed.

20 Claims, 2 Drawing Sheets

Related U.S. Application Data continuation of application No. PCT/US2010/032859, filed on Apr. 28, 2010, and a continuation-in-part of application No. PCT/US2009/002789, filed on May 6, 2009.

(60) Provisional application No. 61/173,375, filed on Apr. 28, 2009, provisional application No. 61/175,430, filed on May 4, 2009, provisional application No. 61/175,456, filed on May 4, 2009, provisional application No. 61/252,657, filed on Oct. 17, 2009, provisional application No. 61/252,749, filed on Oct. 19, 2009.

(51) Int. Cl.
- H01L 33/06 (2010.01)
- H01L 33/22 (2010.01)
- H01L 33/20 (2010.01)
- C09K 11/02 (2006.01)
- B82Y 10/00 (2011.01)
- H01L 33/10 (2010.01)
- G02B 5/20 (2006.01)

(52) U.S. Cl.
CPC ............. *H01L 33/20* (2013.01); *H01L 33/22* (2013.01); *G02B 5/206* (2013.01); *G02B 5/207* (2013.01); *H01L 33/105* (2013.01); *Y10T 428/1317* (2015.01); *Y10T 428/25* (2015.01)

(58) Field of Classification Search
CPC . B82Y 10/00; Y10T 408/25; Y10T 428/1317; B02B 5/206; G02B 5/207
USPC ......... 438/22, 29, 25, 26; 257/7, 13, 98, 746
See application file for complete search history.

(56) References Cited

U.S. PATENT DOCUMENTS

| | | |
|---|---|---|
| 5,557,436 A | 9/1996 | Blose et al. |
| 6,048,616 A | 4/2000 | Gallagher et al. |
| 6,114,038 A | 9/2000 | Castro et al. |
| 6,259,506 B1 | 7/2001 | Lawandy |
| 6,319,426 B1 | 11/2001 | Bawendi et al. |
| 6,322,901 B1 | 11/2001 | Bawendi et al. |
| 6,447,698 B1 | 9/2002 | Ihara et al. |
| 6,473,554 B1 | 10/2002 | Pelka et al. |
| 6,501,091 B1 | 12/2002 | Bawendi et al. |
| 6,576,155 B1 | 6/2003 | Barbera-Guillem |
| 6,576,291 B2 | 6/2003 | Bawendi et al. |
| 6,613,247 B1 | 9/2003 | Hohn et al. |
| 6,710,366 B1 | 3/2004 | Lee et al. |
| 6,714,711 B1 | 3/2004 | Lieberman et al. |
| 6,801,270 B2 | 10/2004 | Faris et al. |
| 6,876,796 B2 | 4/2005 | Garito et al. |
| 6,939,604 B1 | 9/2005 | Guyot-Sionnest et al. |
| 6,957,608 B1 | 10/2005 | Hubert et al. |
| 7,008,559 B2 | 3/2006 | Chen et al. |
| 7,065,285 B2 | 6/2006 | Chen et al. |
| 7,091,653 B2 | 8/2006 | Ouderkirk et al. |
| 7,102,152 B2* | 9/2006 | Chua ...................... B82Y 10/00 257/14 |
| 7,144,131 B2 | 12/2006 | Rains |
| 7,160,613 B2 | 1/2007 | Bawendi et al. |
| 7,168,833 B2 | 1/2007 | Schottland et al. |
| 7,227,177 B2 | 6/2007 | Guyot-Sionnest et al. |
| 7,259,400 B1 | 8/2007 | Taskar |
| 7,294,861 B2 | 11/2007 | Schardt et al. |
| 7,364,925 B2 | 4/2008 | Lee et al. |
| 7,390,568 B2 | 6/2008 | Kim et al. |
| 7,466,885 B2 | 12/2008 | Gugel |
| 7,488,101 B2 | 2/2009 | Brukilacchio |
| 7,496,259 B2 | 2/2009 | Karasawa |
| 7,560,859 B2 | 7/2009 | Saito et al. |
| 7,695,150 B2 | 4/2010 | Dejima et al. |
| 7,703,942 B2 | 4/2010 | Narendran et al. |
| 7,723,744 B2 | 5/2010 | Gillies et al. |
| 7,750,359 B2 | 7/2010 | Narendran et al. |
| 7,772,551 B2 | 8/2010 | Todori et al. |
| 7,834,372 B2 | 11/2010 | Zhai et al. |
| 7,837,348 B2 | 11/2010 | Narendran et al. |
| 7,850,777 B2 | 12/2010 | Peng et al. |
| 7,898,665 B2 | 3/2011 | Brukilacchio et al. |
| 8,021,008 B2 | 9/2011 | Ramer |
| 8,076,410 B2 | 12/2011 | Nayfeh et al. |
| 8,084,934 B2 | 12/2011 | Kim et al. |
| 8,128,249 B2 | 3/2012 | Skipor et al. |
| 8,403,531 B2 | 3/2013 | Negley et al. |
| 8,405,063 B2 | 3/2013 | Kazlas et al. |
| 8,618,561 B2 | 12/2013 | Coe-Sullivan |
| 8,642,977 B2 | 2/2014 | Comerford et al. |
| 8,718,437 B2 | 5/2014 | Coe-Sullivan et al. |
| 8,759,850 B2 | 6/2014 | Coe-Sullivan et al. |
| 9,096,425 B2 | 8/2015 | Coe-Sullivan et al. |
| 9,167,659 B2* | 10/2015 | Coe-Sullivan ........ H01L 33/502 |
| 2002/0127224 A1 | 9/2002 | Chen et al. |
| 2002/0157574 A1 | 10/2002 | Weitzel et al. |
| 2002/0186921 A1 | 12/2002 | Schumacher et al. |
| 2003/0010987 A1 | 1/2003 | Banin et al. |
| 2003/0030706 A1 | 2/2003 | Jagannathan et al. |
| 2003/0048346 A1 | 3/2003 | Chow |
| 2003/0091933 A1 | 5/2003 | Kunita et al. |
| 2003/0194578 A1 | 10/2003 | Tam et al. |
| 2003/0194731 A1 | 10/2003 | Sato et al. |
| 2004/0000868 A1 | 1/2004 | Shimizu et al. |
| 2004/0007169 A1 | 1/2004 | Ohtsu et al. |
| 2004/0110002 A1 | 6/2004 | Kim et al. |
| 2004/0131789 A1 | 7/2004 | Brown |
| 2004/0151898 A1 | 8/2004 | Reiss et al. |
| 2004/0245912 A1 | 12/2004 | Thurk et al. |
| 2004/0262583 A1 | 12/2004 | Lee et al. |
| 2005/0058416 A1 | 3/2005 | Lee et al. |
| 2005/0134723 A1 | 6/2005 | Lee et al. |
| 2005/0135079 A1 | 6/2005 | Chua et al. |
| 2005/0214967 A1 | 9/2005 | Scher et al. |
| 2005/0218377 A1 | 10/2005 | Lawandy |
| 2005/0236556 A1 | 10/2005 | Sargent et al. |
| 2005/0258418 A1 | 11/2005 | Steckel et al. |
| 2005/0266246 A1 | 12/2005 | Reiss et al. |
| 2005/0272159 A1 | 12/2005 | Ismagilov et al. |
| 2006/0003114 A1 | 1/2006 | Enlow et al. |
| 2006/0057480 A1 | 3/2006 | Lin et al. |
| 2006/0067602 A1 | 3/2006 | Todori et al. |
| 2006/0068090 A1 | 3/2006 | Monbouquette et al. |
| 2006/0068154 A1 | 3/2006 | Parce et al. |
| 2006/0069314 A1 | 3/2006 | Farr |
| 2006/0071218 A1 | 4/2006 | Takeda et al. |
| 2006/0081862 A1 | 4/2006 | Chua et al. |
| 2006/0097624 A1* | 5/2006 | Murase .................... C03C 14/00 313/503 |
| 2006/0103589 A1 | 5/2006 | Chua et al. |
| 2006/0105481 A1 | 5/2006 | Boardman et al. |
| 2006/0109682 A1 | 5/2006 | Ko et al. |
| 2006/0157686 A1* | 7/2006 | Jang ....................... B82Y 10/00 257/14 |
| 2006/0174821 A1 | 8/2006 | Sato et al. |
| 2006/0196375 A1 | 9/2006 | Coe-Sullivan et al. |
| 2006/0232194 A1 | 10/2006 | Tung et al. |
| 2007/0012928 A1 | 1/2007 | Peng et al. |
| 2007/0085092 A1 | 4/2007 | Chen |
| 2007/0090755 A1 | 4/2007 | Eida et al. |
| 2007/0103068 A1 | 5/2007 | Bawendi et al. |
| 2007/0138932 A1 | 6/2007 | Morioka et al. |
| 2007/0164661 A1 | 7/2007 | Kuma |
| 2007/0170418 A1 | 7/2007 | Bowers et al. |
| 2007/0221947 A1 | 9/2007 | Locascio et al. |
| 2007/0246734 A1 | 10/2007 | Lee et al. |
| 2007/0259206 A1 | 11/2007 | Oshio |
| 2007/0281140 A1 | 12/2007 | Haubrich et al. |
| 2008/0001167 A1 | 1/2008 | Coe-Sullivan et al. |
| 2008/0029710 A1 | 2/2008 | Sekiya et al. |
| 2008/0037282 A1 | 2/2008 | Kurihara |
| 2008/0038558 A1 | 2/2008 | Lindry et al. |

(56) References Cited

U.S. PATENT DOCUMENTS

| | | |
|---|---|---|
| 2008/0062717 A1 | 3/2008 | Lee |
| 2008/0084706 A1 | 4/2008 | Roshan et al. |
| 2008/0085088 A1 | 4/2008 | Lin et al. |
| 2008/0144333 A1 | 6/2008 | Gourlay et al. |
| 2008/0165235 A1 | 7/2008 | Rolly et al. |
| 2008/0173886 A1 | 7/2008 | Cheon et al. |
| 2008/0188063 A1 | 8/2008 | Alivisatos et al. |
| 2008/0237540 A1 | 10/2008 | Dubrow |
| 2008/0258115 A1 | 10/2008 | Ying et al. |
| 2008/0296534 A1 | 12/2008 | Lifshitz et al. |
| 2008/0308825 A1 | 12/2008 | Chakraborty et al. |
| 2009/0021148 A1 | 1/2009 | Hachiya et al. |
| 2009/0087792 A1 | 4/2009 | Izumi et al. |
| 2009/0114932 A1 | 5/2009 | Chou |
| 2009/0162011 A1 | 6/2009 | Coe-Sullivan et al. |
| 2009/0201577 A1 | 8/2009 | Laplante et al. |
| 2009/0212695 A1 | 8/2009 | Kim et al. |
| 2009/0236621 A1 | 9/2009 | Chakraborty |
| 2009/0272996 A1 | 11/2009 | Chakraborty |
| 2009/0274188 A1 | 11/2009 | Jang et al. |
| 2009/0278141 A1 | 11/2009 | Coe-Sullivan et al. |
| 2009/0280586 A1 | 11/2009 | Coe-Sullivan |
| 2010/0051898 A1 | 3/2010 | Kim et al. |
| 2010/0051901 A1 | 3/2010 | Kazlas et al. |
| 2010/0052512 A1 | 3/2010 | Clough et al. |
| 2010/0103648 A1 | 4/2010 | Kim et al. |
| 2010/0110728 A1 | 5/2010 | Dubrow et al. |
| 2010/0155749 A1 | 6/2010 | Chen et al. |
| 2010/0155786 A1* | 6/2010 | Heald ............... G03F 7/0754 257/213 |
| 2010/0167011 A1 | 7/2010 | Dubrow et al. |
| 2010/0208493 A1 | 8/2010 | Choi et al. |
| 2010/0265307 A1 | 10/2010 | Linton et al. |
| 2010/0283014 A1 | 11/2010 | Breen et al. |
| 2010/0283036 A1 | 11/2010 | Coe-Sullivan et al. |
| 2010/0283072 A1 | 11/2010 | Kazlas et al. |
| 2010/0289044 A1 | 11/2010 | Krames et al. |
| 2010/0314646 A1 | 12/2010 | Breen et al. |
| 2011/0031452 A1 | 2/2011 | Krauss et al. |
| 2011/0068321 A1 | 3/2011 | Picket et al. |
| 2011/0068322 A1 | 3/2011 | Picket et al. |
| 2011/0103064 A1* | 5/2011 | Coe-Sullivan ........ H01L 33/502 362/293 |
| 2011/0186811 A1 | 8/2011 | Coe-Sullivan et al. |
| 2011/0199555 A1 | 8/2011 | Coe-Sullivan et al. |
| 2011/0233483 A1 | 9/2011 | Breen et al. |
| 2011/0309325 A1 | 12/2011 | Park et al. |
| 2012/0061644 A1 | 3/2012 | Steckel et al. |
| 2012/0113672 A1 | 5/2012 | Dubrow et al. |
| 2012/0189791 A1 | 7/2012 | Modi et al. |
| 2012/0313075 A1 | 12/2012 | Linton et al. |
| 2013/0037778 A1 | 2/2013 | Kazlas et al. |
| 2014/0091275 A1 | 4/2014 | Kazlas et al. |

FOREIGN PATENT DOCUMENTS

| | | |
|---|---|---|
| JP | 09-050057 | 2/1997 |
| JP | H-09304623 | 11/1997 |
| JP | 2002091352 | 3/2002 |
| JP | 2002525394 A | 8/2002 |
| JP | 2002525394 A | 8/2002 |
| JP | 2005038768 | 2/2005 |
| JP | 2005538573 A | 12/2005 |
| JP | 2006059723 | 3/2006 |
| JP | 2006073202 | 3/2006 |
| JP | 2006278082 | 10/2006 |
| JP | 2007073206 | 3/2007 |
| JP | 2007103099 | 4/2007 |
| JP | 2007103513 | 4/2007 |
| KR | 2005-0061349 A | 6/2005 |
| KR | 100724035 B1 | 5/2007 |
| KR | 1020100015662 A | 2/2010 |
| WO | 0017655 A1 | 3/2000 |
| WO | WO00/17655 | 3/2000 |
| WO | WO03/084292 | 10/2003 |
| WO | WO2004/023527 | 3/2004 |
| WO | WO2005/086782 | 9/2005 |
| WO | WO-2006005065 | 1/2006 |
| WO | WO2006/055456 | 5/2006 |
| WO | 2006118954 A2 | 11/2006 |
| WO | 2007117668 A2 | 10/2007 |
| WO | 2007117672 A2 | 10/2007 |
| WO | 2007117698 A2 | 10/2007 |
| WO | 2007120877 A2 | 10/2007 |
| WO | WO2008/063658 | 5/2008 |
| WO | WO2008/115498 | 9/2008 |
| WO | WO-2009002512 | 12/2008 |
| WO | 2009035657 A1 | 3/2009 |
| WO | WO2009/151515 | 12/2009 |
| WO | WO-2010129350 | 11/2010 |
| WO | WO-2010129374 | 11/2010 |
| WO | WO2011/060180 | 5/2011 |

OTHER PUBLICATIONS

Dabbousi et al., "(CdSe)AnS Core-Shell Quantum Dots: Synthesis and Characterization of a Size Series of Highly Luminescent Nanocrystallites"; J. Phys. Chem. B.; 1997; 101; 9463-9475.

Kortan et al., "Nucleation and Growth of CdSe on ZnS Quantum Seeds, and Vice Versa, in Inverse Micelle Media"; J. Am. Chem. Soc.; 1990; vol. 112 No. 4; 1327-1332.

Non-Final Office Action dated May 8, 2017; U.S. Appl. No. 14/886,867, filed Oct. 19, 2015 (36 pages).

Li; S., et al., "Surface States in the Photoionization of High-Quality CdSe Core/Shell Nanocrystals" *ACS Nano* (2009), vol. 3, No. 5, pp. 1267-1273. (Published on-line Apr. 17, 2009).

Qin, G.G., "Extended Quantum Confinement/Luminescence Center Model for Photoluminescence From Oxidized Porous Silicon and Nanometer-Si-Particle- or Nanometer-Ge-Particle-Embedded Silicon Oxide Films" *Mater. Res. Bulletin* (1998), Vol, 33, No. 12, pp. 1857-1866.

English Translation of $2^{nd}$ Office Action dated Jul. 30, 2014 in Counterpart Chinese Application No. 201080028919.1.

$2^{nd}$ Office Action dated Jul. 30, 2014 in Counterpart Chinese Application No. 201080028919.1 (Chinese). (D1 (WO 2009002512A1), D2 (Hengqun et al, Chinese J Semiconductors, vol. 2, No, 2, pp. 345-358), and D3 (Achermann, et al., Phys. Rev. B, vol. 68, No. 24, No. 245302, pp. 1-5 Dec. 31, 2003)prevlously of record).

Wang, C., et al., "Light Emission and Amplification in Charged CdSe Quantum Dots", J. Phys. Chem. B, 2004, 108, 9027-9031.

U.S. Appl. No. 61/162,293, filed Mar. 21, 2009.

Bang, et al., "Quantum Dot Sensitized Solar Cells. A Tale of Two Semiconductor Nanocrystals: CdSe and CdTe", *ACS Nano*, vol. 3, No. 6, pp. 1467-1476 (2009).

Haase, et al., "Photochemistry and Radiation Chemistry of Colloidal Semiconductors. 23. Electron Storage on ZnO Particles and Size Quantization", *J. Phys. Chem.*, vol. 92, pp. 482-487 (1988).

Hengleln, et al., "Photochemistry and Radiation Chemistry of Semiconductor Colloids: Reaction of the Hydrated Electron with CdS and Non-Linear Optical Effects", *Chem. Phys. Lett.*, vol. 132, No. 2, pp. 133-136 (1986).

Oda, et al., "Reversible photobluing of CdSe/ZnS/TOPO nanocrystals", *Colloids and Surfaces B: Biointerfaces*, vol. 56, pp. 241-245 (2007).

Wada, et al., "Photoinduced Film Formation of Colloidal CdSe Quantum Dots", *J. Phys. Chem. C*, vol. 112, pp. 17109-17114 (2008).

Achermann, et al., "Multiexcitons confined within a subexcitonic volume; spectroscopic and dynamical signatures of neutral and charged blexcitons in ultrasmall semiconductor nanocrystals", Phys. Rev, B, vol. 68, No. 24, No. 245302, pp. 1-5 (Dec. 31, 2003).

English translation of Office Action dated Dec. 10, 2013 in JP Patent Application No. 2011-508496, which is the Japanese counterpart of copending U.S. Appl. No. 12/940,355.

English Translation of Office Action dated Feb. 10, 2014 in Counterpart Japanese Application No. 2012-508666.

(56) References Cited

OTHER PUBLICATIONS

English translation of Office Action dated May 14, 2013 in JP Patent Application No. 2011-508496, which is the Japanese counterpart of copending U.S. Appl. No. 12/940,355.
English Translation of Office Action dated Sep. 24, 2013 in Counterpart Chinese Application No. 201080028919.1.
English Translation of Search Report dated Sep. 11, 2013 in Counterpart Chinese Application No. 201080028919.1.
Final Office Action dated Jun. 13, 2013, in copending U.S. Appl. No. 13/283,399.
Final Office Action dated Apr. 26, 2013, in copending U.S. Appl. No. 12/940,355.
Notice of Allowance dated Nov. 4, 2013, in copending U.S. Appl. No. 12/940,355.
Non-Final Office Action dated Oct. 11, 2012 in copending U.S. Appl. No. 13/283,399.
Non-Final Office Action dated Mar. 19, 2014, in copending U.S. Appl. No. 12/940,355.
Non-Final Office Action dated Jun. 21, 2012, in copending U.S. Appl. No. 12/940,355.
Non-Final Office Action dated Jul. 30, 2012, in copending U.S. Appl. No. 12/940,355.
Office Action dated Dec. 10, 2013 in JP Patent Application No. 2011-508496, which is the Japanese counterpart of copending U.S. Appl. No. 12/940,355 (Japanese).
Office Action dated Feb. 10, 2014 in Counterpart Japanese Appllcation No. 2012-508666 (Japanese).
Office Action dated May 14, 2013 in JP Patent Application No. 2011-508496, which is the Japanese counterpart of copending U.S. Appl. No. 12/940,355 (Japanese).
Office Action dated Sep. 24, 2013 in Counterpart Chinese Appllcation No. 201080028919.1 (Chinese).
Search Report dated Sep. 11, 2013 in Counterpart Chinese Application No. 201080028919.1 (Chinese).
EP Supplementary European Search Report dated Oct. 31, 2011 in EP 09762812.7 filed from International Application No. PCT/US2009/002789, which is the EP counterpart of copending U.S. Appl. No. 12/940,355.
EP Official Communication dated Aug. 20, 2012 in EP 09762812.7 filed from International Application No. PCT/US2009/002789, which is the EP counterpart of copending U.S. Appl. No. 12/940,355.
Heath, et al, "Covalency in Semiconductor Quantum Dots", Chem. Sec, Rev., 1998, vol. 27, pp. 65-71.
Hengqun, et al., "Photoluminescence and Application of Non-linear Optical Property of nc-SiSiO2Films". Chinese Journal of Semiconductors, vol. 27, No. 2, pp. 345-348; English Abstract at p. 349. (Feb. 28, 2006).
Jarosz, et al "Photoconductivity studies of treated CdSe quantum dot films exhibiting increased exciton ionization efficiency", Phys. Rev, B 70, 195327 (2004), 1-12.
Liao, et al., "Blue luminescence from $Si^+$-Implanted $SiO_2$ films thmally grown on crystalline silicon," Appl. Phys. Lett. 68(6), Feb. 5, 1996, pp. 850-852.
Nayak, M. et al., (2008)"Passivation of CdTe Nanoparticles by Silane Coupling Agent Assited Silica Encapsulation", In 26th Annual Conference on Composites, Advanced Ceramics, Materials, and Structures: *B: Ceramic Engineering and Science Proceedings*, vol. 23, Issue 4 (eds H.-T. Lin and M. Singh), John Wiley & Sons, Inc., Hoboken, NJ, USA.
Oda, et al., "Photoluminescence of CdSe/ZnS/TOPO nanocrystals expanded on silica glass substrates: Adsorption and desorption effects of polar molecules on nanocrystals surfaces", *J. of Luminescence*, 119-120 (2006), pp. 570-575.
PCT Search Report & Written Opinion dated Nov. 13, 2009 in PCT/US2009/002789 filed May 6, 2009 which in the parent of copending U.S. Appl. No. 12/940,355 of Coe-Sullivan, et al. filed Nov. 5, 2010.
Regelman, et al., "Optical spectroscopy of single quantum dots at tunable positive, neutral, and negative charge states", Phys. Rev. B, vol. 64, 165301 (2001) 1-7.
Rohwer, et al., "Development of solid state light sources based on II-VI semiconductor quantum dots", *Proc. of SPIE*, (2004), vol. 5366, pp. 66-74.
Shim, et al., "Doping and Charging in Colloidal Semiconductors Nanocrystals", MRS Bulletin/Dec. 2001, pp. 1005-1008.
Shim, et al., "n-type Colloidal Semiconductor Nanocrystals", Nature, vol. 407, Oct. 26, 2000, pp. 981-.
Shim, et al., "Organic-Capped ZnO Nanocrystals: Synthesis and n-Type Character", J. Am. Chem. Soc., 2001, 123, 11651-11654.
Thoma, et al., "Encapsulation of Nanoparticles for the Manufacture of Solid State Lighting Devices", *Proc. of SPIE*, (2004), vol. 5276, pp. 202-212.
Woo, et al., "Reversible Charging of CdSe Nanocrystals in a Simple Solid-State Device", Adv. Mater. 2002, 14, No. 15, pp. 1068-1071.
Xie, et al., "Synthesis and Characterization of Highly Luminescent CdSe—Core $CdS/Zn_{0.5}Cd_{0.5}S/ZnS$ Multishell Nanocrystals", *J. Am. Chem. Soc.*, 2005, 127, pp. 7480-7488.
Ziegler, Jan, "Ph/D/ thesis Preparation and application of nanocrystals for white LEDs", Oct. 1, 2007, School of Chemical Sciences and Pharmacy, University of East Anglia, Norwich UK, Norwich, UK.
Asaml, H., et al., "Photobrightening and Photodarkening in CdSe Nanocrystal/Polymer Thin Films", Intl. Jrnl. of Nanoscience, vol. 1, Nos. 5&6 2002, 041-04.4.
Asami, H., et al., "Surface State Analysis of Photobrightening in CdSe Nanocrystal Thin Films", J. Phys. Chem B 2003, 107, 12566-12568.
Carrillo-Carrion, C., et al., "Quantum Dots Luminescence Enhancement Due to Illumination With UV/Vis Light" ChemComm, 2009.
Cho, K., et al., "High-performance crosslinked colloidal quantum-dot light-emitting diodes", Nature Photonics, May 24, 2009.
Chon, J.W.M., et al., "Two-photon-induced photoenhancement of densely packed CdSe/ZnSe/ZnS Nanocrystal Solids and its Application to Multilayer Optical Data Storage", Applied Physics Letters, vol. 85, No. 23, Dec. 6, 2004.
Cordero, S.R., et al., "Photo-Activated Luminescence of CdSe Quantum Dot Monolayers", J. Phys. Chem. B 2000, 104, 12137-12142.
DeMello et al., "An Improved Experimental Determination of External Photoluminescence Quantum Efficiency", Advanced Materials 9(3):230 1997.
Duncan, T., et al. "Improving the Quantum Yields of Semiconductor Quantum Dots Through Photoenhancement Assisted by Reducing Agents", The Journal of Physical Chemistry, Apr. 10, 2009.
Farmer, S.C., et al., "Photoluminscent Polymer/Quantum Dot Composite Nanoparticles", Chem.Mater., 2001, 13(11), pp. 3920-3926.
Firth, A.V., et al., "Optical properties of CdSe nanocrystals in a polymer matrix", Applied\Physics Letters, vol. 75, No. 20.
Gomonnai, A.V., et al., "X-Ray Excited Luminescence and X-ray Irradiation, Effect on CdS1-xSes Nanocrystals Optical Absorption", vol. 3, No. 2, Jun. 2001, p. 509-514.
Guyot-Sionnest, P. "Reduced and Oxidized Colloid Quantum Dots" CNRS Seminar, Grenoble, FR, Sep. 2004.
Hess, B.C., et al., "Surface Transformation and Photoinduced Recovery in CdSe Nanocrystals", Physical Review Letters, vol. 86, No. 14.
Jha, P.P., "Trion Decay in Colloidal Quantum Dots", www.acsnano.org, AcNANO, vol. 3., No. 4, 1011-1015 2009.
Jones, M., et al., "Photoenhancement of Luminescence in Colloidal CdSe Quantum Dot Solutions", J. Phys. Chem. B, 2003 107, 11346-11352.
Kim, D., et al., "Layer-by-Layer Assembly of Colloidal CdS and ZnS-CdS Quantum Dots and Improvement of Their Photoluminescence Properties", J. Phys. Chem, 2009, 113, 7015-7018.
Kim, K., et al., "Photoenhancement of a Quantum Dot Nanocomposite via UV Annealing and its Application to White LEDs", Advanced Materials, 23, 911-914, 2011.

(56) References Cited

OTHER PUBLICATIONS

Korsunska, N.E.,et al., "Reversible and non-reversible photo-enhanced luminescence in CdSe/ZnS quantum dots", Institute of Physics Publishing, Jul. 18, 2005.

Kumar, A., et al., "Features of gold having micrometer to centimeter dimensions can be formed through a combination of stamping with an elastomeric stamp and an alkanethiol 'ink' followed by chemical etching", Applied Physics Letters, 63, 2002-2004, (1993).

Lee, S.F., et al., "Brightening, Blinking, Bluing and Bleaching in the Life of a Quantum Dot: Friend or Foe", ChemPhysChem, 2009, 10, 2174-2191.

Liu, C., et al., "Temperature-dependent Brightening and Darkening of Photoluminescence from PbS Quantum Dots in Glasses", Appl. Phys. Lett. 90, 241111 (2007).

Lorenz, J.K., et al., "Surfactant-Semiconductor Interfaces: Perturbation of the Photoluminescence of Bulk Cadmium Selenide by Adsorption of Tri-n-octylphosphine oxide as a probe of solution aggregation with relevance to nanocrystal stabilization", J. Am. Chem. Soc. 1998, 120, 10970-10975.

Miyoshi, T., et al., Photodarkening and Photobrightening in Glasses Doped with CdS and CdSxSe1-x Nanocry, Science Links Japan, vol. 39, No. 11, p. 6290-6292.

Moeller, et al., "Quantum-Dot llght-emitting Devices for Displays", OLED Materials, 2006.

Murase, N., et al., "Anomalous Photoluminescence in Silica-Coated Semiconductor Nanocrystals After Heat Treatment", Small-Journal, 2009, x, 1-4.

Murray et al., "Synthesis and Characterization of Nearly Monodisperse CdE (E=S, Se, Te) Semiconductor Nanocrystallites" J. Am. Chem. Soc., 115:8706 (1993)).

Murray, C., et al., Thesis of "Synthesis and Characterization of II-VI Quantum Dots and Their Assembly into 3-D Quantum Dot Superlattices", Massachusetts Institute of Technology, Sep. 1995.

Nazzal, A.Y., et al., "Environmental Effects on Photoluminescence of Highly Luminescent CdSe and CdSe/ZnS Core/Shell Nanocrystals in Polymer Thin Films", J. Phys. Chem. B. 2004, 108, 5507-5515.

Oda, M., et al., "Photobrightening of CuBr Nanocrystals in PMMA", Jrnl. of Luminescence 87-89 (2000) 469-471.

Oda, M., et al., "Photobrightening of CdSe/ZnS/TOPO Nanocrystals", ScienceDirect, Jour. of Luminescence 122-123 (2007) 762-765.

PCT International Search Report and Written Opinion in International Application No. PCT/US2010/032799 of QD Vision, Inc. dated Jan. 25, 2011.

PCT International Search Report and Written Opinion in International Apllcation No. PCT/US2010/032859 of QD Vision, Inc. dated Nov. 18, 2010.

Peterson, J.J., et al., "Photobrightening and photodarkening in PbS quantum dots", Phys. Chem. Chemical Physics, Jun. 20, 2006.

Polyakov, et al., "Some Aspects of Pulsed Laser Deposition of Si Nanocrystalline Films", The European Physical Journal Applied Ph ysics, Sep. 2009,vol. 48, No. 2, pp. 1-5, p. 2, para 4-5.

Santhanam, V., et al., Microcontact Printing of Uniform Nnaoparticle Arrays, Nano Letters, 4, 41-44, (2004).

Sharma, S.C., "A review of the electro-optical properties and their modification by radiation in polymer-dispersed liquid crystals and thln films containing CdSe/ZnS quantum dots", materials Science & Engineering, 2010 5-15.

Shen, et al., "Assembly of CdS Quantum Dots onto Mesoscopic tiO2 Films for Quantum Dot-Sensitized Solar Cell Applications", Research Express @NCKU (online) 2008, vol. 5, Issue 7, pp. 1-9.

Tsay, J.M., et al., "Enhancing the Photoluminescence of Peptide-Coated Nanocrystals with Shell Composition and UV Irradiation", J Phys Chem B. Feb. 10, 2005; 109(5): 1669-1674.

Venkatram, N.,et al., "Au2+ ion-beam irradiation effects on optical properties of CdSe and CdS quantum dots", Science Direct, Oct. 18, 2007.

Yuan, C.T. et al., "Photoinduced Fluorescence enhancement in colloidal CdSeTe/Zns core/shell quantum dots", Applled Physics Letters 92, 2008.

3rd Office Action dated Mar. 23, 2015 in Chinese Patent Application No. 2010800289191.1 (Chinese). (Reference 3 [Achermann, et al., Phys. Rev. B, vol. 68, No. 24, No. 245302, pp. 1-5, Dec. 31, 2003] is previously of record.).

\* cited by examiner

OPTICAL MATERIALS, OPTICAL COMPONENTS, AND METHODS

This application is a continuation U.S. patent application Ser. No. 13/283,382 filed 27 Oct. 2011, which is a continuation of commonly owned International Application No. PCT/US2010/032859 filed 28 Apr. 2010, which was published in the English language as PCT Publication No. WO 2010/129374 on 11 Nov. 2010, which International Application claims priority to U.S. Application No. 61/173,375 filed 28 Apr. 2009, U.S. Application No. 61/175,430 filed 4 May 2009, U.S. Application No. 61/175,456 filed 4 May 2009, U.S. Application No. 61/252,657 filed 17 Oct. 2009, U.S. Application No. 61/252,749 filed 19 Oct. 2009, and International Application No. PCT/US2009/002789 filed 6 May 2009. Each of the foregoing is hereby incorporated herein by reference in its entirety.

TECHNICAL FIELD OF THE INVENTION

The present invention relates to the technical field of optical materials including nanoparticles, devices and components including optical materials including nanoparticles, and methods.

SUMMARY OF THE INVENTION

The present invention relates to an optical material comprising quantum confined semiconductor nanoparticles that are charge neutral. The present invention also relates to a method for treating an optical material comprising quantum confined semiconductor nanoparticles. The present invention also relates to a treated optical material comprising quantum confined semiconductor nanoparticles. The present invention also relates to a method for treating an optical component including an optical material comprising quantum confined semiconductor nanoparticles. The present invention also relates to a treated optical component including an optical material comprising quantum confined semiconductor nanoparticles. The present invention also relates to devices and components including an optical material taught herein.

In accordance with one aspect of the present invention, there is provided an optical material comprising quantum confined semiconductor nanoparticles, wherein at least a portion of the nanoparticles are in a charge neutral state.

In certain embodiments, substantially all of nanoparticles are in a charge neutral state.

In certain embodiments, optical material further comprises a host material in which the nanoparticles are dispersed.

In certain embodiments, the optical material further comprises light scatterers.

In certain embodiments, the optical material further comprises other optional additives.

In certain embodiments, the optical material can have a solid state photoluminescent efficiency of at least 70%.

For example, the optical material can have solid state photoluminescent of at least 80%, or at least 90%, etc.

In accordance with another aspect of the present invention, there is provided an optical component including an optical material comprising quantum confined semiconductor nanoparticles, wherein at least a portion of the nanoparticles are in a charge neutral state.

In certain embodiments, substantially all of nanoparticles are in a charge neutral state.

In certain embodiments, optical material further comprises a host material in which the nanoparticles are dispersed.

In certain embodiments, the optical material further comprises light scatterers.

In certain embodiments, the optical material further comprises other optional additives.

The optical component can further include a structural member that supports or contains the optical material. Such structural member can have a variety of different shapes or configurations. For example, it can be planar, curved, convex, concave, hollow, linear, circular, square, rectangular, oval, spherical, cylindrical, or any other shape or configuration that is appropriate based on the intended end-use application and design. An example of a common structural components is a substrates such as a plate-like member.

An optical material can be disposed on a surface of a structural member.

In certain embodiments, the optical component further includes a substrate having a surface on which the optical material is disposed.

An optical material can be disposed within a structural member.

The configuration and dimensions of an optical component can be selected based on the intended end-use application and design.

An optical component can include an optical material having a photoluminescent efficiency at least 70%.

For example, the optical material can have solid state photoluminescent of at least 80%, or at least 90%, etc.

In accordance with another aspect of the present invention, there is provided an optical component including an optical material comprising quantum confined semiconductor nanoparticles, wherein at least a portion of the nanoparticles are in a charge neutral state, and wherein the optical material is at least partially encapsulated.

In certain embodiments, substantially all of nanoparticles are in a charge neutral state.

An optical component can include an optical material having a photoluminescent efficiency at least 70%.

For example, the optical material can have solid state photoluminescent of at least 80%, or at least 90%, etc.

In certain embodiments, the optical material further comprises a host material in which the nanoparticles are dispersed.

In certain embodiments, the optical material further comprises light scatterers.

An optical component can include an optical material that is at least partially encapsulated by one or more barrier materials.

Optical material can be partially encapsulated to various extents.

For example, more than 50% of the surface area of the optical material included in the optical component can be protected by one or more barrier materials.

The optical component can further include a structural member that supports or contains the optical material. Such structural member can have a variety of different shapes or configurations. For example, it can be planar, curved, convex, concave, hollow, linear, circular, square, rectangular, oval, spherical, cylindrical, or any other shape or configuration that is appropriate based on the intended end-use application and design. An example of a common structural components is a substrates such as a plate-like member.

The configuration and dimensions of an optical component can be selected based on the intended end-use application and design.

A barrier material may be in the form of a structural member designed and configured based on the intended end-use application for the optical component including same.

In certain embodiments, the optical component further includes a structural member, (e.g., a substrate) having a surface on which the optical material is disposed.

In certain embodiments, the optical material is at least partially encapsulated between opposing substrates.

In certain embodiments, the optical material is at least partially encapsulated by including the optical material on a glass substrate and including a coating over at least a portion of the surface of the optical material opposite the glass substrate.

In certain embodiments, the optical material is disposed on a glass substrate and the optical material is at least partially covered by a coating comprising a barrier material. In certain embodiments, the optical material is disposed on a glass substrate and the optical material is at least partially covered by a coating comprising a barrier material. In certain embodiments, the optical material is disposed on a glass substrate and the optical material is at least partially covered by a coating comprising a material comprising an oxygen barrier. In certain embodiments, the material is substantially oxygen impervious. In certain embodiments, the optical material is disposed on a glass substrate and the optical material is at least partially covered by a coating comprising a material comprising a water barrier. In certain embodiments, the material is substantially water impervious. In certain embodiments, the optical material is disposed on a substrate and the optical material is at least partially covered by a coating comprising a material comprising an oxygen and water barrier. In certain embodiments, the material is substantially oxygen and water impervious.

An optical component can include an optical material that is fully encapsulated.

For example, an optical component can include an optical material that is fully encapsulated by a barrier material, a structural member, or by a combination of two or more barrier materials and/or structural members.

Preferably all of the surface area of the optical material included in an optical component is protected by one or more barrier materials.

In certain embodiments, the optical material is fully encapsulated between opposing substrates that are sealed together by a seal. In certain embodiments, the seal comprises an edge or perimeter seal.

In certain embodiments, a seal can comprise a layer of barrier material that covers the optical material, wherein the optical material and barrier material arrangement is sandwiched between substrates that are sealed together by the layer of barrier material.

In certain embodiments, the seal comprises barrier material.

In certain embodiments, the seal comprises an oxygen barrier.

In certain embodiments, the seal comprises a water barrier.

In certain embodiments, the seal comprises an oxygen and water barrier.

In certain embodiments, the seal is substantially impervious to water and/or oxygen.

In certain embodiments, the optical material is disposed on a glass substrate and the optical material is covered by a coating comprising a barrier material. In certain embodiments, the barrier material comprises an oxygen barrier. In certain embodiments, the material is substantially oxygen impervious. In certain embodiments, the barrier material comprises a water barrier. In certain embodiments, the material is substantially water impervious. In certain embodiments, the barrier material comprises an oxygen and water barrier. In certain embodiments, the material is substantially oxygen and water impervious.

In certain embodiments, the optical material includes a host material comprising a polymer.

In accordance with another aspect of the present invention, there is provided an optical material obtainable by at least partially encapsulating an optical material comprising quantum confined semiconductor nanoparticles and irradiating the at least partially encapsulated optical material with a light flux for a period of time sufficient to neutralize the charge on at least a portion of the nanoparticles.

In certain embodiments, the optical material is at least partially encapsulated by sandwiching the optical material between glass substrates.

An optical material can be at least partially encapsulated by one or more barrier materials.

Optical material can be partially encapsulated to various extents.

For example, more than 50% of the surface area of the optical material can be protected by one or more barrier materials.

In certain embodiments, the optical material is at least partially encapsulated between barriers films.

In certain embodiments, the optical material is at least partially encapsulated by including the optical material on a glass substrate and including a coating over at least a portion of a surface of the optical material opposite the glass substrate.

In certain embodiments, the optical material is at least partially encapsulated by including the optical material on a glass substrate and including a coating over at least a portion of the surface of the optical material opposite the glass substrate.

In certain embodiments, the optical material is disposed on a glass substrate and the optical material is at least partially covered by a coating comprising a barrier material. In certain embodiments, the optical material is disposed on a glass substrate and the optical material is at least partially covered by a coating comprising a barrier material. In certain embodiments, the optical material is disposed on a glass substrate and the optical material is at least partially covered by a coating comprising a material comprising an oxygen barrier. In certain embodiments, the material is substantially oxygen impervious. In certain embodiments, the optical material is disposed on a glass substrate and the optical material is at least partially covered by a coating comprising a material comprising a water barrier. In certain embodiments, the material is substantially water impervious. In certain embodiments, the optical material is disposed on a substrate and the optical material is at least partially covered by a coating comprising a material comprising an oxygen and water barrier. In certain embodiments, the material is substantially oxygen and water impervious.

In certain embodiments, the optical material is fully encapsulated.

An optical material can be fully encapsulated by one or more barrier materials.

Preferably all of the surface area of the optical material is protected by one or more barrier materials.

In certain embodiments, the optical material is fully encapsulated between opposing substrates that are sealed together by a seal. In certain embodiments, the seal comprises an edge or perimeter seal.

In certain embodiments, a seal can comprise a layer of barrier material that covers the optical material, wherein the optical material and barrier material arrangement is sandwiched between substrates that are sealed together by the layer of barrier material.

In certain embodiments, the seal comprises barrier material.

In certain embodiments, the seal comprises an oxygen barrier.

In certain embodiments, the seal comprises a water barrier.

In certain embodiments, the seal comprises an oxygen and water barrier.

In certain embodiments, the seal is substantially impervious to water and/or oxygen.

In certain embodiments, optical material further comprises a host material in which the nanoparticles are dispersed.

In certain embodiments, the optical material further comprises light scatterers.

In certain embodiments, the optical material further comprises other optional additives.

In certain embodiments, the optical material is irradiated for a period of time sufficient to increase photoluminescent efficiency of the optical material by at least 10% of its value prior to irradiation.

In certain embodiments, the optical material is irradiated for a period of time sufficient to increase photoluminescent efficiency of the optical material by at least 20%% of its value prior to irradiation.

In certain embodiments, the optical material is irradiated for a period of time sufficient to increase photoluminescent efficiency of the optical material by at least 30%% of its value prior to irradiation.

In certain embodiments, the optical material is irradiated for a period of time sufficient to increase photoluminescent efficiency of the optical material by at least 40%% of its value prior to irradiation.

In certain embodiments, the optical material is irradiated for a period of time sufficient to increase photoluminescent efficiency of the optical material by at least 50%% of its value prior to irradiation.

In certain embodiments, the optical material is irradiated for a period of time sufficient to increase photoluminescent efficiency of the optical material by at least 20% over the photoluminescent efficiency prior to irradiation.

In certain embodiments, the optical material is irradiated for a period of time sufficient to increase photoluminescent efficiency of the optical material by at least 30% over the photoluminescent efficiency prior to irradiation.

In certain embodiments, the optical material is irradiated by light with a wavelength in a range from about 365 to about 480 nm.

In certain embodiments, the optical material is irradiated by light with a wavelength in a range from about 365 to about 470 nm.

In certain embodiments, the optical material is irradiated by a light source that emits light with a wavelength in a range from about 365 to about 470 nm.

In certain embodiments, a light source comprises an LED light source with peak wavelength in a range from about 365 nm to about 470 nm.

In certain embodiments, a light source comprises a fluorescent lamp that emits light with a wavelength in a range from about 365 nm to about 470 nm.

In certain embodiments, the optical material is irradiated by a light source with peak wavelength of about 450 nm.

In certain embodiments, the optical material is irradiated by an LED light source with peak wavelength of about 450 nm.

In certain embodiments, the light flux is from about 10 to about 100 mW/cm2, preferably from about 20 to about 35 mW/cm2, and more preferably from about 20 to about 30 mW/cm2.

In certain embodiments, the optical material is irradiated by while at a temperature in a range from about 25° to about 80° C.

In accordance with another aspect of the present invention, there is provided an optical component obtainable by at least partially encapsulating an optical material comprising quantum confined semiconductor nanoparticles included in the optical component and irradiating the at least partially encapsulated optical material with a light flux for a period of time sufficient to neutralize the charge on at least a portion of the nanoparticles.

The method can comprise exposing the optical component including at least partially encapsulated optical material to a light flux for a period of time until the solid state photoluminescent efficiency increases to a substantially constant value.

Optical material can be partially encapsulated to various extents.

For example, more than 50% of the surface area of the optical material included in an optical component being treated can be protected by one or more barrier materials.

In certain embodiments, the optical material is at least partially encapsulated by including the optical material between glass substrates.

In certain embodiments, the optical material is at least partially encapsulated between barriers films.

In certain embodiments, the optical material is at least partially encapsulated by including the optical material on a glass substrate and including a coating over at least a portion of the surface of the optical material opposite the glass substrate.

In certain embodiments, the optical material is disposed on a glass substrate and the optical material is at least partially covered by a coating comprising a barrier material. In certain embodiments, the optical material is disposed on a glass substrate and the optical material is at least partially covered by a coating comprising a barrier material. In certain embodiments, the optical material is disposed on a glass substrate and the optical material is at least partially covered by a coating comprising a material comprising an oxygen barrier. In certain embodiments, the material is substantially oxygen impervious. In certain embodiments, the optical material is disposed on a glass substrate and the optical material is at least partially covered by a coating comprising a material comprising a water barrier. In certain embodiments, the material is substantially water impervious. In certain embodiments, the optical material is disposed on a substrate and the optical material is at least partially covered by a coating comprising a material comprising an oxygen and water barrier. In certain embodiments, the material is substantially oxygen and water impervious.

In certain embodiments, the optical material is fully encapsulated.

The optical component can be fully encapsulated by one or more barrier materials.

Preferably all of the surface area of the optical material included in an optical component is protected by one or more barrier materials.

In certain embodiments, the optical material is fully encapsulated between opposing substrates that are sealed together by a seal. In certain embodiments, the seal comprises an edge or perimeter seal.

In certain embodiments, a seal can comprise a layer of barrier material that covers the optical material, wherein the optical material and barrier material arrangement is sandwiched between substrates that are sealed together by the layer of barrier material.

In certain embodiments, the seal comprises barrier material.

In certain embodiments, the seal comprises an oxygen barrier.

In certain embodiments, the seal comprises a water barrier.

In certain embodiments, the seal comprises an oxygen and water barrier.

In certain embodiments, the seal is substantially impervious to water and/or oxygen.

In certain embodiments, the optical material is disposed on a glass substrate and the optical material is covered by a coating comprising a barrier material. In certain embodiments, the barrier material comprises an oxygen barrier. In certain embodiments, the material is substantially oxygen impervious. In certain embodiments, the barrier material comprises a water barrier. In certain embodiments, the material is substantially water impervious. In certain embodiments, the barrier material comprises an oxygen and water barrier. In certain embodiments, the material is substantially oxygen and water impervious.

In certain embodiments, the optical material is irradiated for a period of time sufficient to increase photoluminescent efficiency of the optical material by at least 10% of its value prior to irradiation.

In certain embodiments, the optical material is irradiated for a period of time sufficient to increase photoluminescent efficiency of the optical material by at least 20%% of its value prior to irradiation.

In certain embodiments, the optical material is irradiated for a period of time sufficient to increase photoluminescent efficiency of the optical material by at least 30%% of its value prior to irradiation.

In certain embodiments, the optical material is irradiated for a period of time sufficient to increase photoluminescent efficiency of the optical material by at least 40%% of its value prior to irradiation.

In certain embodiments, the optical material is irradiated for a period of time sufficient to increase photoluminescent efficiency of the optical material by at least 50%% of its value prior to irradiation.

In certain embodiments, the optical material is irradiated for a period of time sufficient to increase photoluminescent efficiency of the optical material by at least 20% over the photoluminescent efficiency prior to irradiation.

In certain embodiments, the optical material is irradiated for a period of time sufficient to increase photoluminescent efficiency of the optical material by at least 30% over the photoluminescent efficiency prior to irradiation.

In certain embodiments, the optical material is irradiated by light with a wavelength in a range from about 365 to about 480 nm.

In certain embodiments, the optical material is irradiated by light with a wavelength in a range from about 365 to about 470 nm.

In certain embodiments, the optical material is irradiated by a light source that emits light with a wavelength in a range from about 365 to about 470 nm.

In certain embodiments, a light source comprises an LED light source with peak wavelength in a range from about 365 nm to about 470 nm.

In certain embodiments, a light source comprises a fluorescent lamp that emits light with a wavelength in a range from about 365 nm to about 470 nm.

In certain embodiments, the optical material is irradiated by a light source with peak wavelength of about 450 nm.

In certain embodiments, the optical material is irradiated by an LED light source with peak wavelength of about 450 nm.

In certain embodiments, the light flux is from about 10 to about 100 mW/cm2, preferably from about 20 to about 35 mW/cm2, and more preferably from about 20 to about 30 mW/cm2.

In certain embodiments, the optical material is irradiated by while at a temperature in a range from about 25° to about 80° C.

In certain embodiments, the optical material further comprises a host material in which the nanoparticles are dispersed. In certain embodiments, the host material comprises a polymer.

In certain embodiments, the optical material further comprises light scatterers.

In certain embodiments, the optical material further comprises other optional additives.

In certain embodiments, the optical material is encapsulated between glass plates that are sealed together.

In certain embodiments including a seal, the seal can comprise a barrier material. In certain embodiments, the seal can comprise an oxygen barrier. In certain embodiments, the seal can comprise a water barrier. In certain embodiments, the seal can comprise an oxygen and water barrier. In certain embodiments, the seal is substantially impervious to water and/or oxygen In certain embodiments, the optical material is encapsulated between glass plates that are sealed together by a glass-to-glass perimeter or edge seal.

In certain embodiments, the optical material is encapsulated between glass plates that are sealed together by a glass-to-metal perimeter or edge seal.

In certain embodiments, the optical material is encapsulated between glass plates that are sealed together by an epoxy or other sealant with barrier material properties.

In certain embodiments, the optical material is encapsulated between barriers films.

In certain embodiments, a seal can comprise a layer of barrier material that covers the optical material, wherein the optical material and barrier material arrangement is sandwiched between substrates that are sealed together by the layer of barrier material.

In accordance with another aspect of the present invention, there is provided a method for treating an optical material comprising quantum confined semiconductor nanoparticles, the method comprising irradiating the optical material comprising quantum confined semiconductor nanoparticles with a light flux for a period of time sufficient to neutralize the charge on at least a portion of the nanoparticles.

In certain embodiments, the optical material is irradiated for a period of time sufficient to increase photoluminescent efficiency of the optical material by at least 10% of its value prior to irradiation.

In certain embodiments, the optical material is irradiated for a period of time sufficient to increase photoluminescent efficiency of the optical material by at least 20%% of its value prior to irradiation.

In certain embodiments, the optical material is irradiated for a period of time sufficient to increase photoluminescent efficiency of the optical material by at least 30%% of its value prior to irradiation.

In certain embodiments, the optical material is irradiated for a period of time sufficient to increase photoluminescent efficiency of the optical material by at least 40%% of its value prior to irradiation.

In certain embodiments, the optical material is irradiated for a period of time sufficient to increase photoluminescent efficiency of the optical material by at least 50%% of its value prior to irradiation.

In certain embodiments, the optical material is irradiated for a period of time sufficient to increase photoluminescent efficiency of the optical material by at least 20% over the photoluminescent efficiency prior to irradiation.

In certain embodiments, the optical material is irradiated for a period of time sufficient to increase photoluminescent efficiency of the optical material by at least 30% over the photoluminescent efficiency prior to irradiation.

In certain embodiments, the optical material is irradiated by light with a wavelength in a range from about 365 to about 480 nm.

In certain embodiments, the optical material is irradiated by light with a wavelength in a range from about 365 to about 470 nm.

In certain embodiments, the optical material is irradiated by a light source that emits light with a wavelength in a range from about 365 to about 470 nm.

In certain embodiments, a light source comprises an LED light source with peak wavelength in a range from about 365 nm to about 470 nm.

In certain embodiments, a light source comprises a fluorescent lamp that emits light with a wavelength in a range from about 365 nm to about 470 nm.

In certain embodiments, the optical material is irradiated by a light source with peak wavelength of about 450 nm.

In certain embodiments, the optical material is irradiated by an LED light source with peak wavelength of about 450 nm.

In certain embodiments, the light flux is from about 10 to about 100 mW/cm2, preferably from about 20 to about 35 mW/cm2, and more preferably from about 20 to about 30 mW/cm2.

In certain embodiments, the optical material is irradiated by while at a temperature in a range from about 25° to about 80° C.

In accordance with another aspect of the present invention, there is provided a method for treating an optical component including an optical material comprising quantum confined semiconductor nanoparticles, the method comprising irradiating the optical component including an optical material comprising quantum confined semiconductor nanoparticles with a light flux for a period of time sufficient to neutralize the charge on at least a portion of the nanoparticles.

In certain embodiments, the optical material is irradiated for a period of time sufficient to increase photoluminescent efficiency of the optical material by at least 10%% of its value prior to irradiation.

In certain embodiments of the foregoing methods, the optical material is irradiated for a period of time sufficient to increase photoluminescent efficiency of the optical material by at least 20%% of its value prior to irradiation.

In certain embodiments of the foregoing methods, the optical material is irradiated for a period of time sufficient to increase photoluminescent efficiency of the optical material by at least 30%% of its value prior to irradiation.

In certain embodiments of the foregoing methods, the optical material is irradiated for a period of time sufficient to increase photoluminescent efficiency of the optical material by at least 40%% of its value prior to irradiation.

In certain embodiments of the foregoing methods, the optical material is irradiated for a period of time sufficient to increase photoluminescent efficiency of the optical material by at least 50%% of its value prior to irradiation.

In certain embodiments of the foregoing methods, the optical material is irradiated for a period of time sufficient to increase photoluminescent efficiency of the optical material by at least 20% over the photoluminescent efficiency prior to irradiation.

In certain embodiments of the foregoing methods, the optical material is irradiated for a period of time sufficient to increase photoluminescent efficiency of the optical material by at least 30% over the photoluminescent efficiency prior to irradiation.

In certain embodiments of the foregoing methods, the irradiation is carried out in a nitrogen atmosphere.

In certain embodiments of the foregoing methods, the irradiation is carried out in an atmosphere that includes oxygen (e.g., air).

In certain embodiments of the foregoing methods, the irradiation is carried out in an inert atmosphere.

In certain embodiments of the foregoing methods, the optical material is at least partially encapsulated while being irradiated.

Optical material can be partially encapsulated to various extents.

For example, more than 50% of the surface area of the optical material included in an optical component can be protected by one or more barrier materials.

In certain embodiments of the foregoing methods, the optical material is at least partially encapsulated by including the optical material on a glass substrate and including a coating over at least a portion of a surface of the optical material opposite the glass substrate.

In certain embodiments of the foregoing methods, the optical material is encapsulated between barriers films.

In certain embodiments of the foregoing methods, the optical material is disposed on a glass substrate and the optical material is at least partially covered by a coating comprising a barrier material. In certain embodiments, the optical material is disposed on a glass substrate and the optical material is at least partially covered by a coating comprising a barrier material. In certain embodiments, the optical material is disposed on a glass substrate and the optical material is at least partially covered by a coating comprising a material comprising an oxygen barrier. In certain embodiments, the material is substantially oxygen impervious. In certain embodiments, the optical material is disposed on a glass substrate and the optical material is at least partially covered by a coating comprising a material comprising a water barrier. In certain embodiments, the material is substantially water impervious. In certain embodiments, the optical material is disposed on a substrate and the optical material is at least partially covered by a coating comprising a material comprising an oxygen and water barrier. In certain embodiments, the material is substantially oxygen and water impervious.

In certain embodiments of the foregoing methods, the optical material is at least partially encapsulated by sandwiching the optical material between glass substrates. In certain embodiments, the optical material is at least partially encapsulated by including the optical material on a glass substrate and including a coating over at least a portion of the surface of the optical material opposite the glass substrate.

In certain embodiments of the foregoing methods, the optical material is disposed on a glass substrate and the optical material is at least partially covered by a coating comprising a barrier material. In certain embodiments, the optical material is disposed on a glass substrate and the optical material is at least partially covered by a coating comprising a material comprising an oxygen barrier. In certain embodiments, the material is substantially oxygen impervious. In certain embodiments, the optical material is disposed on a glass substrate and the optical material is at least partially covered by a coating comprising a material comprising a water barrier. In certain embodiments, the material is substantially water impervious. In certain embodiments, the optical material is disposed on a substrate and the optical material is at least partially covered by a coating comprising a material comprising an oxygen and water barrier. In certain embodiments, the material is substantially oxygen and water impervious.

In certain embodiments of the foregoing methods, the optical material is fully encapsulated while being irradiated.

An optical material can be fully encapsulated by one or more barrier materials.

Preferably all of the surface area of the optical material included in an optical component is protected by one or more barrier materials.

In certain embodiments, the optical material is fully encapsulated between opposing substrates that are sealed together by a seal. In certain embodiments, the seal comprises an edge or perimeter seal.

In certain embodiments, a seal can comprise a layer of barrier material that covers the optical material, wherein the optical material and barrier material arrangement is sandwiched between substrates that are sealed together by the layer of barrier material.

In certain embodiments, the seal comprises barrier material.

In certain embodiments, the seal comprises an oxygen barrier.

In certain embodiments, the seal comprises a water barrier.

In certain embodiments, the seal comprises an oxygen and water barrier.

In certain embodiments, the seal is substantially impervious to water and/or oxygen.

In certain embodiments of the foregoing methods, the optical material is disposed on a glass substrate and the optical material is covered by a coating comprising a barrier material. In certain embodiments, the barrier material comprises an oxygen barrier. In certain embodiments, the material is substantially oxygen impervious. In certain embodiments, the barrier material comprises a water barrier. In certain embodiments, the material is substantially water impervious. In certain embodiments, the barrier material comprises an oxygen and water barrier. In certain embodiments, the material is substantially oxygen and water impervious.

In certain embodiments, the optical material is irradiated by light with a wavelength in a range from about 365 to about 480 nm.

In certain embodiments of the foregoing methods, the optical material is irradiated by light with a wavelength in a range from about 365 to about 470 nm.

In certain embodiments, the optical material is irradiated by a light source that emits light with a wavelength in a range from about 365 to about 470 nm.

In certain embodiments, a light source comprises an LED light source with peak wavelength in a range from about 365 nm to about 470 nm.

In certain embodiments, a light source comprises a fluorescent lamp that emits light with a wavelength in a range from about 365 nm to about 470 nm.

In certain embodiments of the foregoing methods, the optical material is irradiated by a light source with peak wavelength of about 450 nm.

In certain embodiments of the foregoing methods, the optical material is irradiated by a an LED light source with peak wavelength of about 450 nm.

In certain embodiments of the foregoing methods, the light flux is from about 10 to about 100 mW/cm2, preferably from about 20 to about 35 mW/cm2, and more preferably from about 20 to about 30 mW/cm2.

In certain embodiments of the foregoing methods, the optical material is irradiated by while at a temperature in a range from about 25° to about 80° C.

In certain embodiments of the foregoing methods, the optical material further comprises a host material in which the nanoparticles are dispersed. In certain embodiments, the host material comprises a polymer. In certain embodiments, the optical material further comprises light scatterers. In certain embodiments, the optical material further comprises other optional additives.

In certain embodiments of the foregoing methods, the optical material is encapsulated between glass plates that are sealed together while being irradiated.

In certain embodiments of the foregoing methods, the optical material is encapsulated between glass plates that are sealed together by a glass-to-glass perimeter or edge seal while being irradiated.

In certain embodiments of the foregoing methods, the optical material can be encapsulated between glass plates that can be sealed together by a glass-to-metal perimeter or edge seal while being irradiated.

In certain embodiments of the foregoing methods, the optical material can be encapsulated between barrier materials (e.g., glass plates) that can be sealed together by a layer of barrier material that covers the optical material, wherein the optical material and barrier material arrangement is sandwiched between the glass plates that are sealed together by the layer of barrier material.

In certain embodiments of the foregoing methods, the optical material is encapsulated between glass plates that are sealed together by an epoxy or other sealant with barrier material properties.

In certain embodiments, the optical material is encapsulated between barriers films, such as hardcoated polyester.

In certain embodiments, color attributes of photoluminescent emission from the treated optical component are stabilized. In certain embodiments, peak emission wavelength of photoluminescent emission from the treated optical component is stabilized. In certain embodiments, color temperature of photoluminescent emission from the treated optical component is stabilized. In certain embodiments, brightness of photoluminescent emission from the treated optical component is stabilized.

In certain embodiments of the foregoing methods, substantially all of the quantum confined semiconductor nanoparticles are charge neutral.

In accordance with another aspect of the present invention, there is provided an optical material obtainable by at least partially encapsulating an optical material comprising quantum confined semiconductor nanoparticles that was previously handled in the presence of oxygen and irradiating the at least partially encapsulated optical material with a light flux for a period of time sufficient to neutralize the charge on at least a portion of the nanoparticles.

In certain embodiments, the optical material is irradiated for a period of time sufficient to increase photoluminescent efficiency of the optical material by at least 10%% of its value prior to irradiation.

In certain embodiments, the optical material is irradiated for a period of time sufficient to increase photoluminescent efficiency of the optical material by at least 30%% of its value prior to irradiation.

In certain embodiments, the optical material is irradiated for a period of time sufficient to increase photoluminescent efficiency of the optical material by at least 40%% of its value prior to irradiation.

In certain embodiments, the optical material is irradiated for a period of time sufficient to increase photoluminescent efficiency of the optical material by at least 50%% of its value prior to irradiation.

In accordance with another aspect of the present invention, there is provided a device including an optical material taught herein.

In accordance with another aspect of the present invention, there is provided a device including an optical component taught herein.

As used herein, "encapsulation" refers to protection against oxygen. In certain embodiments, encapsulation can be complete (also referred to herein as full encapsulation or fully encapsulated). In certain embodiments, encapsulation can be less than complete (also referred to herein as partial encapsulation or partially encapsulated).

As used herein, "barrier material" refers to a material that provides protection against at least oxygen.

The foregoing, and other aspects and embodiments described herein all constitute embodiments of the present invention.

As used herein, "solid state external quantum efficiency" (also referred to herein as "EQE" or "solid state photoluminescent efficiency" or "solid state quantum efficiency") is measured in a 12" integrating sphere using a NIST traceable calibrated light source, using the method developed by Mello et al., Advanced Materials 9(3):230 (1997), which is hereby incorporated by reference.

The foregoing, and other aspects and embodiments described herein all constitute embodiments of the present invention.

It should be appreciated by those persons having ordinary skill in the art(s) to which the present invention relates that any of the features described herein in respect of any particular aspect and/or embodiment of the present invention can be combined with one or more of any of the other features of any other aspects and/or embodiments of the present invention described herein, with modifications as appropriate to ensure compatibility of the combinations. Such combinations are considered to be part of the present invention contemplated by this disclosure.

It is to be understood that both the foregoing general description and the following detailed description are exemplary and explanatory only and are not restrictive of the invention as claimed. Other embodiments will be apparent to those skilled in the art from consideration of the specification and practice of the invention disclosed herein.

Figure 1:
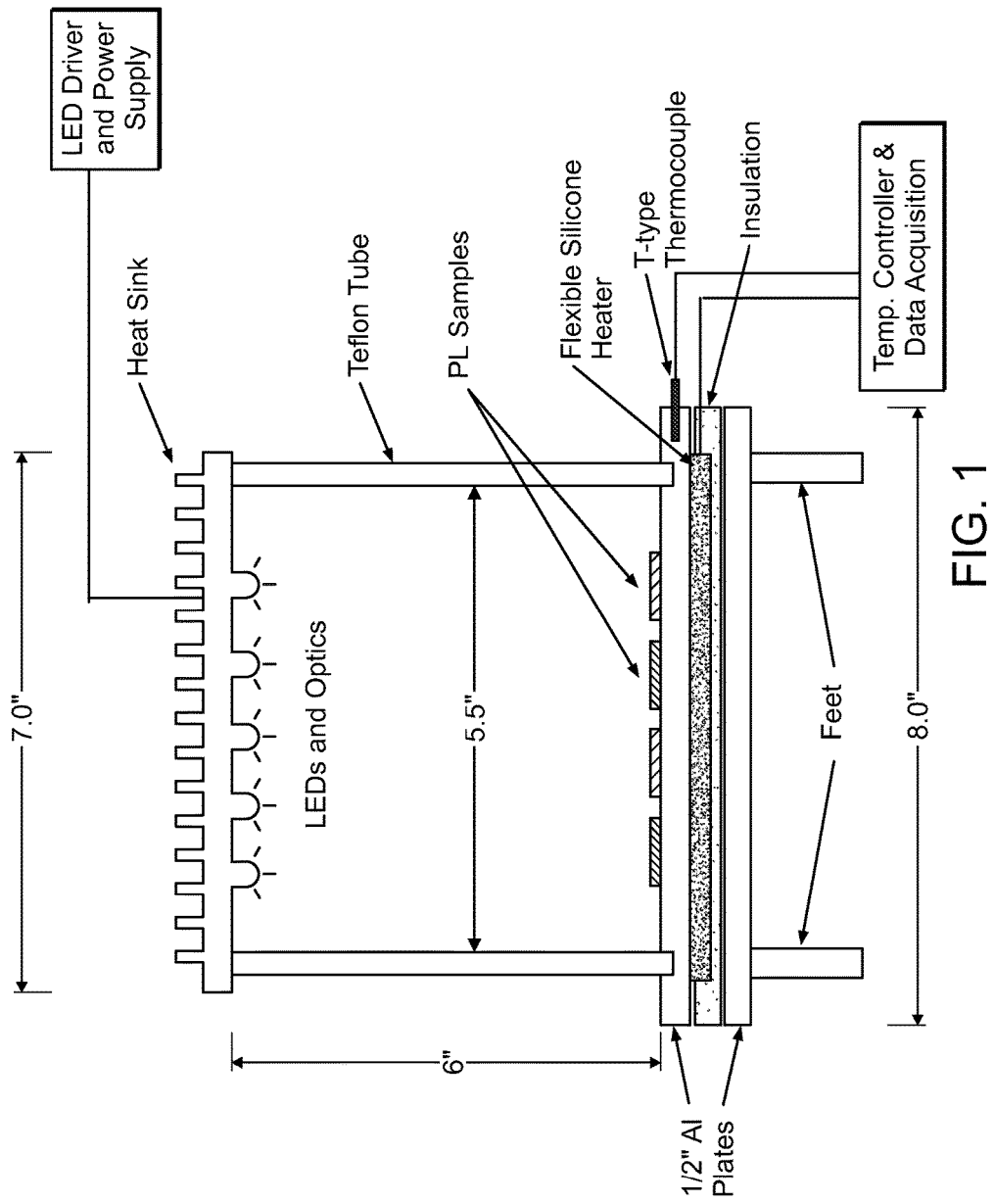
FIG. 1 depicts a schematic of a non-limiting example of an arrangement that can be used with methods described herein.

The attached figures are simplified representations presented for purposes of illustration only; the actual structures may differ in numerous respects, particularly including the relative scale of the articles depicted and aspects thereof.

For a better understanding to the present invention, together with other advantages and capabilities thereof, reference is made to the following disclosure and appended claims in connection with the above-described drawings.

DETAILED DESCRIPTION OF THE INVENTION

Various aspects and embodiments of the present inventions will be further described in the following detailed description.

In accordance with one aspect of the present invention, there is provided an optical material comprising quantum confined semiconductor nanoparticles, wherein at least a portion of the nanoparticles are in a charge neutral state.

In certain embodiments, substantially all of nanoparticles are in a charge neutral state.

In certain embodiments, optical material further comprises a host material in which the nanoparticles are dispersed.

In certain embodiments, the optical material further comprises light scatterers.

In certain embodiments, the optical material further comprises other optional additives.

An optical material can have a solid state photoluminescent efficiency of at least 70%.

For example, the optical material can have solid state photoluminescent of at least 80%, or at least 90%, etc.

In accordance with another aspect of the present invention, there is provided an optical component including an optical material comprising quantum confined semiconductor nanoparticles, wherein at least a portion of the nanoparticles are in a charge neutral state, and wherein the optical material is at least partially encapsulated.

In certain embodiments, substantially all of nanoparticles are in a charge neutral state.

In certain embodiments, the optical material further comprises a host material in which the nanoparticles are dispersed.

In certain embodiments, the optical material includes a host material comprising a polymer.

In certain embodiments, the optical material further comprises light scatterers.

In certain embodiments, the optical material further comprises other optional additives.

The optical component can further include a structural member that supports or contains the optical material. Such structural member can have a variety of different shapes or configurations. For example, it can be planar, curved, convex, concave, hollow, linear, circular, square, rectangular, oval, spherical, cylindrical, or any other shape or configuration that is appropriate based on the intended end-use application and design. An example of a common structural components is a substrates such as a plate-like member.

An optical material can be disposed on a surface of a structural member.

In certain embodiments, the optical component further includes a substrate having a surface on which the optical material is disposed.

In certain embodiments, the optical material is at least partially encapsulated between opposing substrates.

In another example, an optical component can comprise an optical material included within a structural member. For example, an optical material can be included in a hollow or cavity portion of a tubular-like structural member (e.g., a tube, hollow capillary, hollow fiber, etc.) that can be open at either or both ends.

Other designs, configurations, and combinations of barrier materials and/or structural members comprising barrier materials can be included in an optical component in which the optical material is at least partially encapsulated. Such designs, configurations, and combinations can be selected based on the intended end-use application and design.

Barrier material included in an optical component can be optically transparent to permit light to pass into and/or out of optical material that it may encapsulate.

In certain embodiments, the optical material is fully encapsulated.

An optical component can include an optical material that is fully encapsulated by a barrier material or structural member or by a combination of two or more barrier materials and/or structural members.

Preferably all of the surface area of the optical material included in an optical component is protected by one or more barrier materials.

In certain embodiments, the optical material is fully encapsulated between opposing substrates that are sealed together by a seal. In certain embodiments, one or both of the substrates comprise glass.

In certain embodiments, the seal comprises an edge or perimeter seal. In certain embodiments, the seal comprises barrier material. In certain embodiments, the seal comprises an oxygen barrier. In certain embodiments, the seal comprises a water barrier. In certain embodiments, the seal comprises an oxygen and water barrier. In certain embodiments, the seal is substantially impervious to water and/or oxygen.

In certain embodiments, the optical material is disposed on a substrate and the optical material is covered by a coating comprising a barrier material. In certain embodiments, the substrate comprises glass. In certain embodiments, the optical material is disposed on a glass substrate and the optical material is covered by a coating comprising a material comprising an oxygen barrier. In certain embodiments, the material is substantially oxygen impervious. In certain embodiments, the optical material is disposed on a glass substrate and the optical material is covered by a coating comprising a material comprising a water barrier. In certain embodiments, the material is substantially water impervious. In certain embodiments, the optical material is disposed on a substrate and the optical material is covered by a coating comprising a material comprising an oxygen and water barrier. In certain embodiments, the material is substantially oxygen and water impervious.

In accordance with another aspect of the present invention, there is provided an optical material obtainable by at least partially encapsulating an optical material comprising quantum confined semiconductor nanoparticles and irradiating the at least partially encapsulated optical material with a light flux for a period of time sufficient to neutralize the charge on at least a portion of the nanoparticles.

In certain embodiments, the optical material is at least partially encapsulated by sandwiching the optical material between substrates. In certain embodiments, one or both of the substrates comprise glass.

In certain embodiments, the optical material is at least partially encapsulated by including the optical material on a substrate and including a coating over at least a portion of the surface of the optical material opposite the substrate. In certain embodiments, the substrate comprises glass. In certain embodiments, the coating comprises a barrier material.

In certain embodiments, the optical material is disposed on a glass substrate and the optical material is at least partially covered by a coating comprising a barrier material. In certain embodiments, the optical material is disposed on a glass substrate and the optical material is at least partially covered by a coating comprising a material comprising an oxygen barrier. In certain embodiments, the material is substantially oxygen impervious. In certain embodiments, the optical material is disposed on a glass substrate and the optical material is at least partially covered by a coating comprising a material comprising a water barrier. In certain embodiments, the material is substantially water impervious. In certain embodiments, the optical material is disposed on a substrate and the optical material is at least partially covered by a coating comprising a material comprising an oxygen and water barrier. In certain embodiments, the material is substantially oxygen and water impervious.

In certain embodiments, the optical material is fully encapsulated.

In certain embodiments, the optical material is fully encapsulated between opposing substrates that are sealed together by a seal. In certain embodiments, one or both of the substrates comprise glass. In certain embodiments, the seal comprises an edge or perimeter seal.

In certain embodiments, the seal comprises barrier material. In certain embodiments, the seal comprises an oxygen barrier. In certain embodiments, the seal comprises a water barrier. In certain embodiments, the seal comprises an oxygen and water barrier. In certain embodiments, the seal is substantially impervious to water and/or oxygen. In certain embodiments, optical material further comprises a host material in which the nanoparticles are dispersed.

In certain embodiments, the optical material further comprises light scatterers. In certain embodiments, the optical material further comprises other optional additives.

In accordance with another aspect of the present invention, there is provided an optical component obtainable by at least partially encapsulating an optical component including an optical material comprising quantum confined semiconductor nanoparticles and irradiating the at least partially encapsulated optical material with a light flux for a period of time sufficient to neutralize the charge on at least a portion of the nanoparticles.

In certain embodiments, the optical material is at least partially encapsulated by including the optical material on a substrate and including a coating over at least a portion of the surface of the optical material opposite the substrate. In certain embodiments, the substrate comprises glass. In certain embodiments, the coating comprises a barrier material, In certain embodiments, the optical material is disposed on a glass substrate and the optical material is at least partially covered by a coating comprising a barrier material. In certain embodiments, the optical material is disposed on a glass substrate and the optical material is at least partially covered by a coating comprising a material comprising an oxygen barrier. In certain embodiments, the material is substantially oxygen impervious. In certain embodiments, the optical material is disposed on a glass substrate and the optical material is at least partially covered by a coating comprising a material comprising a water barrier. In certain embodiments, the material is substantially water impervious. In certain embodiments, the optical material is disposed on a substrate and the optical material is at least partially covered by a coating comprising a material comprising an oxygen and water barrier. In certain embodiments, the material is substantially oxygen and water impervious.

In certain embodiments, the optical material is at least partially encapsulated by sandwiching the optical material between substrates. In certain embodiments, one or both of the substrates comprise glass.

In certain embodiments, the optical material is at least partially encapsulated by including the optical material on a substrate and including a coating over at least a portion of the surface of the optical material opposite the substrate. In certain embodiments, the substrate comprises glass. In certain embodiments, the coating comprises a barrier material.

In certain embodiments, the optical material is disposed on a glass substrate and the optical material is at least partially covered by a coating comprising a barrier material. In certain embodiments, the optical material is disposed on a glass substrate and the optical material is at least partially covered by a coating comprising a material comprising an oxygen barrier. In certain embodiments, the material is substantially oxygen impervious. In certain embodiments, the optical material is disposed on a glass substrate and the optical material is at least partially covered by a coating comprising a material comprising a water barrier. In certain embodiments, the material is substantially water impervious. In certain embodiments, the optical material is disposed on a substrate and the optical material is at least partially covered by a coating comprising a material comprising an oxygen and water barrier. In certain embodiments, the material is substantially oxygen and water impervious.

In certain embodiments, the optical material is fully encapsulated.

In certain embodiments, the optical material is fully encapsulated between opposing substrates that are sealed together by a seal. In certain embodiments, the seal comprises an edge or perimeter seal. In certain embodiments, one or both of the substrates comprise glass.

In certain embodiments, the seal comprises barrier material. In certain embodiments, the seal comprises an oxygen barrier. In certain embodiments, the seal comprises a water barrier. In certain embodiments, the seal comprises an oxygen and water barrier. In certain embodiments, the seal is substantially impervious to water and/or oxygen.

In certain embodiments, the optical material is disposed on a substrate and the optical material is covered by a coating comprising a barrier material. In certain embodiments, the substrate comprises glass. In certain embodiments, the barrier material comprises an oxygen barrier. In certain embodiments, the material is substantially oxygen impervious. In certain embodiments, the barrier material comprises a water barrier. In certain embodiments, the material is substantially water impervious. In certain embodiments, the barrier material comprises an oxygen and water barrier. In certain embodiments, the material is substantially oxygen and water impervious.

In certain embodiments, the optical material is irradiated for a period of time sufficient to increase photoluminescent efficiency of the optical material by at least 10%% of its value prior to irradiation.

In certain embodiments, the optical material is irradiated for a period of time sufficient to increase photoluminescent efficiency of the optical material by at least 20%% of its value prior to irradiation.

In certain embodiments, the optical material is irradiated for a period of time sufficient to increase photoluminescent efficiency of the optical material by at least 30%% of its value prior to irradiation.

In certain embodiments, the optical material is irradiated for a period of time sufficient to increase photoluminescent efficiency of the optical material by at least 40%% of its value prior to irradiation.

In certain embodiments, the optical material is irradiated for a period of time sufficient to increase photoluminescent efficiency of the optical material by at least 50%% of its value prior to irradiation.

In certain embodiments, the optical material is irradiated for a period of time sufficient to increase photoluminescent efficiency of the optical material by at least 20% over the photoluminescent efficiency prior to irradiation.

In certain embodiments, the optical material is irradiated for a period of time sufficient to increase photoluminescent efficiency of the optical material by at least 30% over the photoluminescent efficiency prior to irradiation.

In certain embodiments, the optical material is irradiated by light with a wavelength in a range from about 365 to about 480 nm.

In certain embodiments, the optical material is irradiated by light with a wavelength in a range from about 365 to about 470 nm.

In certain embodiments, the optical material is irradiated by a light source that emits light with a wavelength in a range from about 365 to about 470 nm.

In certain embodiments, a light source comprises an LED light source with peak wavelength in a range from about 365 nm to about 470 nm.

In certain embodiments, a light source comprises a fluorescent lamp that emits light with a wavelength in a range from about 365 nm to about 470 nm.

In certain embodiments, the optical material is irradiated by a light source with peak wavelength of about 450 nm.

In certain embodiments, the optical material is irradiated by an LED light source with peak wavelength of about 450 nm.

In certain embodiments, the light flux is from about 10 to about 100 mW/cm2, preferably from about 20 to about 35 mW/cm2, and more preferably from about 20 to about 30 mW/cm2.

In certain embodiments, the optical material is irradiated by while at a temperature in a range from about 25° to about 80° C.

In certain embodiments, the optical material further comprises a host material in which the nanoparticles are dispersed. In certain embodiments, the host material comprises a polymer.

In certain embodiments, the optical material further comprises light scatterers.

In certain embodiments, the optical material is encapsulated between substrates that are sealed together. In certain embodiments, one or both of the substrates comprise glass. In certain embodiments, the seal comprises a barrier material.

In certain embodiments, the optical material is encapsulated between glass plates that are sealed together by a glass-to-glass perimeter or edge seal.

In certain embodiments, the optical material is encapsulated between glass plates that are sealed together by a glass-to-metal perimeter or edge seal, In certain embodiments, the optical material is encapsulated between glass plates that are sealed together by an epoxy or other sealant with barrier material properties.

In certain embodiments, the optical material is encapsulated between barriers films, such as hardcoated polyester.

In accordance with another aspect of the present invention, there is provided a method for treating an optical component including an optical material comprising quantum confined semiconductor nanoparticles, the method comprising irradiating the optical component including an optical material comprising quantum confined semiconductor nanoparticles with a light flux for a period of time sufficient to neutralize the charge on at least a portion of the nanoparticles.

In certain embodiments, the optical material is irradiated for a period of time sufficient to increase photoluminescent efficiency of the optical material by at least 10%% of its value prior to irradiation.

In certain embodiments, the optical material is irradiated for a period of time sufficient to increase photoluminescent efficiency of the optical material by at least 20%% of its value prior to irradiation.

In certain embodiments, the optical material is irradiated for a period of time sufficient to increase photoluminescent efficiency of the optical material by at least 30%% of its value prior to irradiation.

In certain embodiments, the optical material is irradiated for a period of time sufficient to increase photoluminescent efficiency of the optical material by at least 40%% of its value prior to irradiation.

In certain embodiments, the optical material is irradiated for a period of time sufficient to increase photoluminescent efficiency of the optical material by at least 50%% of its value prior to irradiation.

In certain embodiments, the optical material is irradiated for a period of time sufficient to increase photoluminescent efficiency of the optical material by at least 20% over the photoluminescent efficiency prior to irradiation.

In certain embodiments, the optical material is irradiated for a period of time sufficient to increase photoluminescent efficiency of the optical material by at least 30% over the photoluminescent efficiency prior to irradiation.

In certain embodiments, the optical component is irradiated in a nitrogen atmosphere.

In certain embodiments, the optical component is irradiated in an atmosphere that includes oxygen (e.g., air).

In certain embodiments, the optical component is irradiated in an inert atmosphere.

In certain embodiments, the optical component is at least partially encapsulated while being irradiated In certain embodiments, the optical material is at least partially encapsulated by including the optical material on a substrate and including a coating over at least a portion of the surface of the optical material opposite the substrate. In certain embodiments, the substrate comprises glass. In certain embodiments, the coating comprises a barrier material.

In certain embodiments, the optical material is disposed on a glass substrate and the optical material is at least partially covered by a coating comprising a barrier material. In certain embodiments, the optical material is disposed on a glass substrate and the optical material is at least partially covered by a coating comprising a material comprising an oxygen barrier. In certain embodiments, the material is substantially oxygen impervious. In certain embodiments, the optical material is disposed on a glass substrate and the optical material is at least partially covered by a coating comprising a material comprising a water barrier. In certain embodiments, the material is substantially water impervious. In certain embodiments, the optical material is disposed on a substrate and the optical material is at least partially covered by a coating comprising a material comprising an oxygen and water barrier. In certain embodiments, the material is substantially oxygen and water impervious.

In certain embodiments, the optical material is at least partially encapsulated by sandwiching the optical material between substrates. In certain embodiments, one or both of the substrates comprise glass.

In certain embodiments, the optical material is at least partially encapsulated by including the optical material on a substrate and including a coating over at least a portion of the surface of the optical material opposite the substrate. In certain embodiments, the substrate comprises glass. In certain embodiments, the coating comprises a barrier material.

In certain embodiments, the optical material is disposed on a glass substrate and the optical material is at least partially covered by a coating comprising a barrier material. In certain embodiments, the optical material is disposed on a glass substrate and the optical material is at least partially covered by a coating comprising a barrier material. In certain embodiments, the optical material is disposed on a glass substrate and the optical material is at least partially covered by a coating comprising a material comprising an oxygen barrier. In certain embodiments, the material is substantially oxygen impervious. In certain embodiments, the optical material is disposed on a glass substrate and the optical material is at least partially covered by a coating comprising a material comprising a water barrier. In certain embodiments, the material is substantially water impervious. In certain embodiments, the optical material is disposed on a substrate and the optical material is at least partially covered by a coating comprising a material comprising an oxygen and water barrier. In certain embodiments, the material is substantially oxygen and water impervious.

In certain embodiments, the optical material is fully encapsulated while being irradiated. In certain embodiments, the optical material is fully encapsulated between opposing substrates that are sealed together by a seal.

In certain embodiments, one or both of the substrates comprise glass.

In certain embodiments, the seal comprises an edge or perimeter seal.

In certain embodiments, the seal comprises barrier material.

A seal can comprise a layer of barrier material, e.g., that covers the optical material, wherein the optical material and barrier material arrangement is sandwiched between the substrates or other barrier materials that are sealed together by the layer of barrier material.

In certain embodiments, the seal comprises an oxygen barrier. In certain embodiments, the seal comprises a water barrier. In certain embodiments, the seal comprises an oxygen and water barrier. In certain embodiments, the seal is substantially impervious to water and/or oxygen.

In certain embodiments, the optical material is disposed on a substrate and the optical material is covered by a coating comprising a barrier material. In certain embodiments, the substrate comprises glass. In certain embodiments, the barrier material comprises an oxygen barrier. In certain embodiments, the material is substantially oxygen impervious. In certain embodiments, the barrier material comprises a water barrier. In certain embodiments, the material is substantially water impervious. In certain embodiments, the barrier material comprises an oxygen and water barrier. In certain embodiments, the material is substantially oxygen and water impervious.

In certain embodiments, the optical material is irradiated by light with a wavelength in a range from about 365 to about 480 nm.

In certain embodiments, the optical material is irradiated by light with a wavelength in a range from about 365 to about 470 nm.

In certain embodiments, the optical material is irradiated by a light source that emits light with a wavelength in a range from about 365 to about 470 nm.

In certain embodiments, a light source comprises an LED light source with peak wavelength in a range from about 365 nm to about 470 nm.

In certain embodiments, a light source comprises a fluorescent lamp that emits light with a wavelength in a range from about 365 nm to about 470 nm.

In certain embodiments, the optical material is irradiated by a light source with peak wavelength of about 450 nm.

In certain embodiments, the optical material is irradiated by an LED light source with peak wavelength of about 450 nm.

In certain embodiments, the light flux is from about 10 to about 100 mW/cm2, preferably from about 20 to about 35 mW/cm2, and more preferably from about 20 to about 30 mW/cm2.

In certain embodiments, the optical material is irradiated by while at a temperature in a range from about 25° to about 80° C.

In certain embodiments, the optical material further comprises a host material in which the nanoparticles are dispersed.

In certain embodiments, the host material comprises a polymer.

In certain embodiments, the optical material further comprises light scatterers.

In certain embodiments, the optical material is encapsulated between glass plates that are sealed together while being irradiated.

In certain embodiments, the optical material is encapsulated between glass plates that are sealed together by a glass-to-glass perimeter or edge seal while being irradiated.

In certain embodiments, the optical material is encapsulated between glass plates that are sealed together by a glass-to-metal perimeter or edge seal while being irradiated.

In certain embodiments, the optical material is encapsulated between glass plates that are sealed together by an epoxy or other sealant with barrier material properties.

In certain embodiments, a seal can comprise a layer of barrier material that covers the optical material, wherein the optical material and barrier material arrangement is sandwiched between glass plates that are sealed together by the layer of barrier material.

In certain embodiments, the optical material is encapsulated between barriers films, such as hardcoated polyester.

In certain embodiments, color attributes of photoluminescent emission from the treated optical component are stabilized. In certain embodiments, peak emission wavelength of photoluminescent emission from the treated optical component is stabilized. In certain embodiments, color temperature of photoluminescent emission from the treated optical component is stabilized. In certain embodiments, brightness of photoluminescent emission from the treated optical component is stabilized.

In certain embodiments, substantially all of the quantum confined semiconductor nanoparticles are charge neutral.

In aspects and embodiments of the inventions taught herein that include irradiating an optical material or optical component, the light flux on the material or component being irradiated is preferably uniform.

FIG. 1 provides a schematic diagram of an example of a set-up that can be useful in carrying out the methods taught herein. In the Figure, "PL Samples" refer to placement of optical materials and/or optical components in the configuration during treatment. As depicted, the light sources are LEDs, but as discussed herein, other types of light sources can be used. The inner surface of the set-up can be light reflective.

In certain embodiments, the optical material and/or component can be heated during irradiation. Such heating can comprise, for example, carrying out the irradiation step in an oven (e.g., an IR oven, a convection oven, etc.), on a hot plate, etc. Other heating techniques readily ascertainable by the skill artisan can also be used. Heating of the optical material and/or optical component during irradiation can accelerate or assist the radiation effects thereon.

Examples of light sources that can be utilized for the irradiation step include, but are not limited to, blue (e.g., 400-500 nm) light-emitting diodes (LEDs), white light-emitting LEDS, blue emitting fluorescent lamps, etc.

Examples of blue emitting fluorescent lamps are available from NARVA (Germany). In certain embodiments, the light source comprises NARVA model LT 54 W T-5-HQ/0182 blue 2.

Light flux is preferably measured at the surface being irradiated. Examples of techniques that can be used to measure light flux include UV detectors that is sensitive to the wavelength of the radiation source. For example, an Ophir Nova Laser Power Meter (part number 7Z01500) including an Ophir UV detector head (part number PD300-UV-SH-ROHS) (preferably a detector head filter is installed) can be used with a 450 nm LED radiation source.

Optical materials of the present invention include quantum confined semiconductor nanoparticles. Quantum confined semiconductor nanoparticles can confine electrons and holes and have a photoluminescent property to absorb light and re-emit different wavelength light. Color characteristics of emitted light from quantum confined semiconductor nanoparticles depend on the size of the quantum confined semiconductor nanoparticles and the chemical composition of the quantum confined semiconductor nanoparticles.

In certain embodiments, the quantum confined semiconductor nanoparticles include at least one type of quantum confined semiconductor nanoparticle with respect to chemical composition, structure, and size. The type(s) of quantum confined semiconductor nanoparticles included in an optical component in accordance with the invention are determined by the wavelength desired for the particular end-use application in which the optical component will be used.

As discussed herein, quantum confined semiconductor nanoparticles may or may not include a shell and/or a ligand on a surface thereof. In certain embodiments, a shell and/or ligand can passivate quantum confined semiconductor nanoparticles to prevent agglomeration or aggregation to overcome the Van der Waals binding force between the nanoparticles. In certain embodiments, the ligand can comprise a material having an affinity for any host material in which a quantum confined semiconductor nanoparticle may be included. As discussed herein, in certain embodiments, a shell comprises an inorganic shell.

In certain embodiments, two or more different types of quantum confined semiconductor nanoparticles (based on composition, structure and/or size) may be included in an optical material, wherein each type is selected to obtain light having a predetermined color.

In certain embodiments, an optical material comprises one or more different types of quantum confined semiconductor nanoparticles (based on composition, structure and/or size), wherein each different type of quantum confined semiconductor nanoparticles emits light at predetermined wavelength that is different from the predetermined wavelength emitted by at least one of any other type of quantum confined semiconductor nanoparticles included in the optical material, and wherein the one or more different predetermined wavelengths are selected based on the end-use application.

In certain embodiments including two or more different types of quantum confined semiconductor nanoparticles that emit at different predetermined wavelengths, the different types of quantum confined semiconductor nanoparticles can be included in two or more different optical materials.

In certain embodiments including two or more different optical materials, such different optical materials can, for example, be included as separate layers of a layered arrangement and/or as separate features of a patterned layer that includes features including features of more than one of the optical materials.

In certain embodiments, an optical material comprises quantum confined semiconductor nanoparticles distributed in a host material. Preferably, the host material comprises a solid host material. Examples of a host material useful in various embodiments and aspect of the inventions described herein include polymers, monomers, resins, binders, glasses, metal oxides, and other nonpolymeric materials. Preferred host materials include polymeric and non-polymeric materials that are at least partially transparent, and preferably fully transparent, to preselected wavelengths of light. In certain embodiments, the preselected wavelengths can include wavelengths of light in the visible (e.g., 400-700 nm) region of the electromagnetic spectrum. Preferred host materials include cross-linked polymers and solvent-cast polymers. Examples of preferred host materials include, but are not limited to, glass or a transparent resin. In particular, a resin such as a non-curable resin, heat-curable resin, or photocurable resin is suitably used from the viewpoint of processability. As specific examples of such a resin, in the form of either an oligomer or a polymer, a melamine resin, a phenol resin, an alkyl resin, an epoxy resin, a polyurethane resin, a maleic resin, a polyamide resin, polymethyl methacrylate, polyacrylate, polycarbonate, polyvinyl alcohol, polyvinylpyrrolidone, hydroxyethylcellulose, carboxymethylcellulose, copolymers containing monomers forming these resins, and the like. Other suitable host materials can be identified by persons of ordinary skill in the relevant art.

In certain embodiments and aspects of the inventions contemplated by this disclosure, a host material comprises a photocurable resin. A photocurable resin may be a preferred host material in certain embodiments, e.g., embodiments in which the composition is to be patterned. As a photocurable resin, a photo-polymerizable resin such as an acrylic acid or methacrylic acid based resin containing a reactive vinyl group, a photo-crosslinkable resin which generally contains a photo-sensitizer, such as polyvinyl cinnamate, benzophenone, or the like may be used. A heat-curable resin may be used when the photo-sensitizer is not used. These resins may be used individually or in combination of two or more.

In certain embodiments and aspects of the invention contemplated by this disclosure, a host material comprises a solvent-cast resin. A polymer such as a polyurethane resin, a maleic resin, a polyamide resin, polymethyl methacrylate, polyacrylate, polycarbonate, polyvinyl alcohol, polyvinylpyrrolidone, hydroxyethylcellulose, carboxymethylcellulose, copolymers containing monomers forming these resins, and the like can be dissolved in solvents known to those skilled in the art. Upon evaporation of the solvent, the resin forms a solid host material for the semiconductor nanoparticles.

In certain embodiments, light scatterers and/or other additives (e.g., wetting or leveling agents) can also be included in optical material.

Examples of light scatterers (also referred to herein as scatterers or light scattering particles) that can be used in the embodiments and aspects of the inventions described herein, include, without limitation, metal or metal oxide particles, air bubbles, and glass and polymeric beads (solid or hollow). Other light scatterers can be readily identified by those of ordinary skill in the art. In certain embodiments, scatterers have a spherical shape. Preferred examples of scattering particles include, but are not limited to, $TiO_2$, $SiO_2$, $BaTiO_3$, $BaSO_4$, and $ZnO$. Particles of other materials that are non-reactive with the host material and that can increase the absorption pathlength of the excitation light in the host material can be used. In certain embodiments, light scatterers may have a high index of refraction (e.g., $TiO_2$, $BaSO_4$, etc) or a low index of refraction (gas bubbles).

Selection of the size and size distribution of the scatterers is readily determinable by those of ordinary skill in the art. The size and size distribution can be based upon the refractive index mismatch of the scattering particle and the host material in which it the light scatterer is to be dispersed, and the preselected wavelength(s) to be scattered according to Rayleigh scattering theory. The surface of the scattering particle may further be treated to improve dispersability and stability in the host material. In one embodiment, the scattering particle comprises $TiO_2$ (R902+ from DuPont) of 0.2 µm particle size, in a concentration in a range from about 0.001 to about 5% by weight. In certain preferred embodiments, the concentration range of the scatterers is between 0.1% and 2% by weight.

In certain embodiments, an optical material including quantum confined semiconductor nanoparticles and a host material can be formed from an ink comprising quantum confined semiconductor nanoparticles and a liquid vehicle, wherein the liquid vehicle comprises a composition including one or more functional groups that are capable of being cross-linked. The functional units can be cross-linked, for example, by UV treatment, thermal treatment, or another cross-linking technique readily ascertainable by a person of ordinary skill in a relevant art. In certain embodiments, the composition including one or more functional groups that are capable of being cross-linked can be the liquid vehicle itself. In certain embodiments, it can be a co-solvent. In certain embodiments, it can be a component of a mixture with the liquid vehicle. In certain embodiments, the ink can further include light scatterers.

In certain preferred embodiments of the inventions contemplated by this disclosure, quantum confined semiconductor nanoparticles (e.g., semiconductor nanocrystals) are distributed within the host material as individual particles.

In certain embodiments of an optical material further including a host material, quantum confined semiconductor nanoparticles included in an optical material in an amount is from about 0.001 to about 5 weight percent of the host material. In certain preferred embodiments, is the optical material includes from about 0.1 to about 3 weight percent quantum confined semiconductor nanoparticles based on the weight of the host material. In certain more preferred embodiments, the composition includes from about 0.5 to about 3 weight percent quantum confined semiconductor nanoparticles based on the weight of the host material. In certain embodiments including light scatterers, the optical includes from about 0.001 to about 5 weight percent scatterers based on the weight of the optical material.

An optical component can further include a structural member that supports or contains the optical material. Such structural member can have a variety of different shapes or configurations. For example, it can be planar, curved, convex, concave, hollow, linear, circular, square, rectangular, oval, spherical, cylindrical, or any other shape or configuration that is appropriate based on the intended end-use application and design. An example of a common structural components is a substrates such as a plate-like member.

An optical material can be disposed on a surface of a structural member.

In certain embodiments, the optical component further includes a substrate having a surface on which the optical material is disposed.

An optical material can be disposed within a structural member.

The configuration and dimensions of an optical component can be selected based on the intended end-use application and design.

An example of a common structural components is a substrates such as a plate-like member.

In certain aspects and embodiments of the inventions taught herein, a substrate can comprise a rigid material, e.g., glass, polycarbonate, acrylic, quartz, sapphire, or other known rigid materials.

In certain embodiments including one or more glass substrates, substrate can comprise borosilicate glass, soda-lime glass, and aluminosilicate glass. Other glasses can be readily ascertained by one of ordinary skill in the art.

In certain embodiments, the substrate can comprise a flexible material, e.g., a polymeric material such as plastic (e.g. but not limited to thin acrylic, epoxy, polycarbonate, PEN, PET, PE) or silicone.

In certain embodiments, the substrate can comprise a flexible material including a silica or glass coating thereon. Preferably the silica or glass coating is sufficiently thin to retain the flexible nature of the base flexible material.

In certain embodiments, the substrate is substantially optically transparent to wavelengths of interest for the particular end-use application. In certain embodiments, the substrate is at least 90% transparent. In certain embodiments, the substrate is at least 95% transparent. In certain embodiments, the substrate is at least 99% transparent.

In certain embodiments, the substrate is optically translucent.

In certain embodiments, the substrate has a transmission haze (as defined in ASTM D1003-0095) in a range from about 0.1% to about 5%. (ASTM D1003-0095 is hereby incorporated herein by reference.)

In certain embodiments, one or both of the major surfaces of the substrate is smooth.

In certain embodiments, one or both major surfaces of the substrate can be corrugated.

In certain embodiments, one or both major surfaces of the substrate can be roughened.

In certain embodiments, one or both major surfaces of the substrate can be textured.

In certain embodiments, one or both major surfaces of the substrate can be concave.

In certain embodiments, one or both major surfaces of the substrate can be convex.

In certain embodiments, one major surface of the substrate can comprise microlenses.

In certain embodiments, a substrate include one or more surfaces that is flat, concave, convex, or featured (e.g., including one or more positive or negative features). Other surface characteristics may also be included based on the particular end-use application.

In certain embodiments, the geometrical shape and dimensions of a substrate can be selected based on the particular end-use application.

In certain embodiments, the thickness of the substrate is substantially uniform.

In certain embodiments, an optical component includes at least one layer including an optical material comprising quantum confined semiconductor nanoparticles. In certain embodiments including more than one type of quantum confined semiconductor nanoparticles, each type can be disposed as a separate layer.

In certain embodiments, the optical material is disposed across a major surface of a substrate.

In certain embodiments, the optical material is disposed as an uninterrupted layer across a major surface of the substrate.

In certain embodiments, a layer of optical material can have a thickness from about 0.1 to about 200 microns. In certain embodiments, the thickness can be from about 10 to about 200 microns. In certain embodiments, the thickness can be from about 30 to about 80 microns.

In certain embodiments, other optional layers may also be included.

While further including may be undesirable for energy considerations, there may be instances in which a filter is included for other reasons. In such instances, a filter may be included. In certain embodiments, a filter may cover all or at least a predetermined portion of the substrate. In certain embodiments, a filter can be included for blocking the passage of one or more predetermined wavelengths of light. A filter layer can be included over or under the optical material. In certain embodiments, an optical component can include multiple filter layers on various surfaces of the substrate. In certain embodiments, a notch filter layer can be included.

In certain embodiments, one or more anti-reflection coatings can be included in the optical component.

In certain embodiments, one or more wavelength selective reflective coatings can be included in the optical component. Such coatings can, for example, reflect light back toward the light source.

In certain embodiments, for example, an optical component may further include outcoupling members or structures across at least a portion of a surface thereof. In certain embodiments, outcoupling members or structures may be uniformly distributed across a surface. In certain embodiments, outcoupling members or structures may vary in shape, size, and/or frequency in order to achieve a more uniform light distribution outcoupled from the surface. In certain embodiments, outcoupling members or structures may be positive, e.g., sitting or projecting above the surface of optical component, or negative, e.g., depressions in the surface of the optical component, or a combination of both.

In certain embodiments, an optical component can further include a lens, prismatic surface, grating, etc. on the surface thereof from which light is emitted. Other coatings can also optionally be included on such surface.

In certain embodiments, outcoupling members or structures can be formed by molding, embossing, lamination, applying a curable formulation (formed, for example, by techniques including, but not limited to, spraying, lithography, printing (screen, inkjet, flexography, etc), etc.).

In certain embodiments, a substrate can include light scatterers.

In certain embodiments, a substrate can include air bubbles or air gaps.

In certain embodiments, an optical component can include one or more major, surfaces with a flat or matte finish.

In certain embodiments, an optical component can include one or more surfaces with a gloss finish.

Example of barrier films or coatings for use in certain embodiments of the invention taught herein include, without limitation, a hard metal oxide coating, a thin glass layer, and Barix coating materials available from Vitex Systems, Inc. Other barrier films or coating can be readily ascertained by one of ordinary skill in the art.

In certain embodiments, more than one barrier film or coating can be used to fully or partially encapsulate the optical material.

Barrier material included in an optical component can be optically transparent to permit light to pass into and/or out of optical material that it may encapsulate.

A barrier material member can be flexible (e.g. but not limited to thin acrylic, epoxy, polycarbonate, PEN, PET, PE).

A barrier material can be a composite, consisting of multiple layers of different components, or coatings on a substrate.

A barrier material can be rigid (e.g. but not limited to glass, thick acrylic, thick transparent polymers, may be a composite or coated with layers (e.g. $SiO_x$) to improve barrier properties)

In certain embodiments including a seal, the seal can comprise glass frit, glass frit in a binder system, solder in combination with a metallized substrate. In certain embodiments, other sealants can be used. Other known techniques for sealing glass-to-glass, glass-to-metal, and barrier films or sealants together can be used.

In certain aspects and embodiments of the inventions taught herein, an optical component can optionally further include a cover, coating or layer for protection from the environment (e.g., dust, moisture, and the like) and/or scratching or abrasion.

In certain aspects and embodiments of the inventions taught herein, the optical material (e.g., comprising quantum confined semiconductor nanoparticles dispersed in a host material (preferably a polymer or glass)) is exposed to light flux for a period of time sufficient to increase the photoluminescent efficiency of the optical material. In certain embodiments, the optical material is exposed to light and heat for a period of time sufficient to increase the photoluminescent efficiency of the optical material. In certain embodiments, the exposure to light or light and heat is continued for a period of time until the photoluminescent efficiency reaches a substantially constant value.

In certain embodiments, a light source that emits light with a wavelength in a range from about 365 to about 480 nm is used as the source of light. In certain embodiments, a light source that emits light with a wavelength in a range from about 365 to about 470 nm is used as the source of light. In certain embodiments, a light source comprises an LED light source with peak wavelength in a range from about 365 nm to about 470 nm. In certain embodiments, a light source comprises a fluorescent lamp that emits light with a wavelength in a range from about 365 nm to about 470 nm. In certain embodiments, the optical material is irradiated by a light source with peak wavelength of about 450 nm. In certain embodiments, an LED light source with peak wavelength of about 450 nm is used as the source of light. Other known light sources can be readily identified by the skilled artisan. In certain embodiments, the light flux is from about 10 to about 100 mW/cm², preferably from about 20 to about 35 mW/cm², and more preferably from about 20 to about 30 mW/cm². In embodiments that include exposing the optical material to light and heat, the optical material is exposed to light while at a temperature in a range from about 25° to about 80° C. In certain embodiments, the optical material (e.g., comprising quantum confined semiconductor nanoparticles dispersed in a host material (preferably a polymer or glass)) can be encapsulated (for example, a layer of optical material can be disposed between glass plates) when exposed to light, whether or not heat is also applied. In certain examples, the glass plates can further be sealed together around the perimeter or edge. In certain embodiments, the seal comprises barrier material. In certain embodiments, the seal comprises an oxygen barrier. In certain embodiments, the seal comprises a water barrier. In certain embodiments, the seal comprises an oxygen and water barrier. In certain embodiments, the seal is substantially impervious to water and/or oxygen. Examples of sealing techniques include, but are not limited to, glass-to-glass seal, glass-to-metal seal, sealing materials that are substantially impervious to oxygen and/or water, epoxies and other sealing materials that slow down penetration of oxygen and/or moisture. In certain embodiments, the optical material (e.g., comprising quantum confined semiconductor nanoparticles dispersed in a host material (preferably a polymer or glass)) can be partially encapsulated when exposed to light, whether or not heat is also applied.

Photoluminescent efficiency can be measured, for example, with use of a spectrophotometer in an integrating sphere including a NIST traceable calibrated light source.

Figure 2:
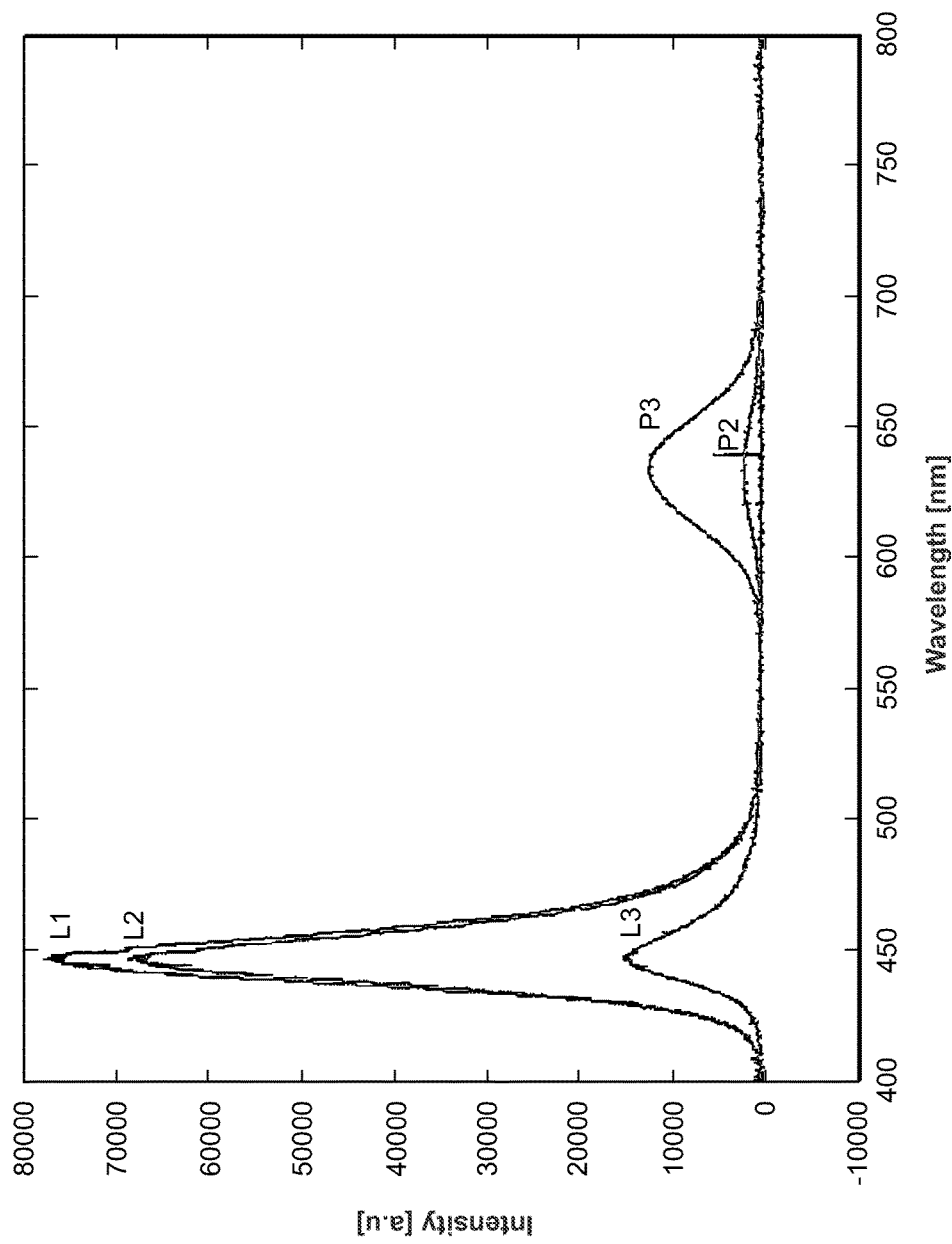
FIG. 2 depicts spectra to illustrate a method for measuring quantum efficiency.

For example, External Quantum Efficiency (EQE) can be measured in a 12" integrating sphere using a NIST traceable calibrated light source, using the method developed by Mello et al., Advanced Materials 9(3):230 (1997), which is hereby incorporated by reference. The method uses a collimated 450 nm LED source, an integrating sphere and a spectrometer. Three measurements are taken. First, the LED directly illuminates the integrating sphere giving a spectrum labeled L1 and shown in FIG. 2 (which graphically represents emission intensity (a.u.) as a function of wavelength (nm)) for purposes of example in describing this method. Next, the PL sample is placed into the integrating sphere so that only diffuse LED light illuminates the sample giving the (L2+P2) spectrum shown for purposes of example in FIG. 2. Finally, the PL sample is placed into the integrating sphere so that the LED directly illuminates the sample (just off normal incidence) giving the (L3+P3) spectrum shown for purposes of example 4. After collecting the data, each spectral contribution (L's and P's) is computed. L1, L2 and L3 correspond to the sums of the LED spectra for each measurement and P2 and P3 are the sums associated with the PL spectra for 2nd and 3rd measurements. The following equation then gives the external PL quantum efficiency:

$$EQE = [(P3 \cdot L2) \text{minus} (P2 \cdot L3)] / (L1 \cdot (L2 \text{ minus } L3))$$

EXAMPLES

Example 1

Preparation of Semiconductor Nanocrystals
A. Preparation of Semiconductor Nanocrystals Capable of Emitting 588 nm Light with 3,5-Di-Tert-Butyl-4-Hydroxybenzylphosphonic Acid Synthesis of CdSe Cores: 1.75 mmol cadmium acetate is dissolved in 15.7 mmol of tri-n-octylphosphine at 140° C. in a 20 mL vial and then dried and degassed for one hour. 31.0 mmol of trioctylphosphine oxide and 4 mmol of octadecylphosphonic acid are added to a 3-neck flask and dried and degassed at 110° C. for one hour. After degassing, the Cd solution is added to the oxide/acid flask and the mixture is heated to 270° C. under nitrogen. Once the temperature reaches 270° C., 16 mmol of tri-n-butylphosphine is injected into the flask. The temperature is brought back to 270° C. where 2.3 mL of 1.5 M TBP-Se is then rapidly injected. The reaction mixture is heated at 270° C. for 30 seconds and then the heating mantle is removed from the reaction flask allowing the solution to cool to room temperature. The CdSe cores are precipitated out of the growth solution inside a nitrogen atmosphere glovebox by adding a 3:1 mixture of methanol and isopropanol. The isolated cores are then dissolved in hexane and used to make core-shell materials. (Abs/Emission/FWHM (nm)=518/529/26.5). Synthesis of CdSe/CdZnS Core-Shell Nanocrystals: Two identical reactions are set up whereby 25.86 mmol of trioctylphosphine oxide and 2.4 mmol of 3,5-di-tert-butyl-4-hydroxybenzylphosphonic acid are loaded into 50 mL four-neck round bottom flasks. The mixtures are then dried and degassed in the reaction vessels by heating to 120° C. for about an hour. The flasks are then cooled to 70° C. and the hexane solution containing isolated CdSe cores from above (0.062 mmol Cd content) are added to the respective reaction mixture. The hexane is removed under reduced pressure. Dimethyl cadmium, diethyl zinc, and hexamethyldisilathiane are used as the Cd, Zn, and S precursors, respectively. The Cd and Zn are mixed in equimolar ratios while the S was in two-fold excess relative to the Cd and Zn. Two sets of Cd/Zn (0.31 mmol of dimethylcadmium and diethylzinc) and S (1.24 mmol of hexamethyldisilathiane) samples are each dissolved in 4 mL of trioctylphosphine inside a nitrogen atmosphere glove box. Once the precursor solutions are prepared, the reaction flasks are heated to 155° C. under nitrogen. The Cd/Zn and S precursor solutions are added dropwise to the respective reaction flasks over the course of 2 hours at 155° C. using a syringe pump. After the shell growth, the nanocrystals are transferred to a nitrogen atmosphere glovebox and precipitated out of the growth solution by adding a 3:1 mixture of methanol and isopropanol. The isolated core-shell nanocrystals are then dispersed in toluene and the solutions from the two batches are combined B. Preparation of Semiconductor Nanocrystals Capable of Emitting 632 nm Light with 3,5-Di-Tert-Butyl-4-Hydroxybenzylphosphonic Acid Synthesis of CdSe Cores: 29.9 mmol cadmium acetate is dissolved in 436.7 mmol of tri-n-octylphosphine at 140° C. in a 250 mL 3-neck round-bottom schlenk flask and then dried and degassed for one hour. 465.5 mmol of trioctylphosphine oxide and 61.0 mmol of octadecylphosphonic acid are added to a 0.5 L glass reactor and dried and degassed at 120° C. for one hour. After degassing, the Cd solution is added to the reactor containing the oxide/acid and the mixture is heated to 270° C. under nitrogen. Once the temperature reaches 270° C., 243.2 mmol of tri-n-butylphosphine is injected into the flask. The temperature is brought back to 270° C. where 33.3 mL of 1.5 M TBP-Se is then rapidly injected. The reaction mixture is heated at 270° C. for ~9 minutes at which point the heating mantle is removed from the reaction flask and the mixture is allowed to cool to room temperature. The CdSe cores are precipitated out of the growth solution inside a nitrogen atmosphere glovebox by adding a 3:1 mixture of methanol and isopropanol. The isolated cores are then dissolved in hexane and used to make core-shell materials. (Abs/Emission/FWHM (nm)=571/592/45)

Synthesis of CdSe/CdZnS Core-Shell Nanocrystals: Three identical reactions are conducted whereby 517.3 mmol of trioctylphosphine oxide and 48.3 mmol of 3,5-di-tert-butyl-4-hydroxybenzylphosphonic acid are loaded into a 0.5 L glass reactor. The mixtures are then dried and degassed in the reactor by heating to 120° C. for about an hour. The reactors are then cooled to 70° C. and hexane solutions containing the isolated CdSe cores from above (1.95 mmol Cd content) are added to the respective reaction mixtures. The hexane is removed under reduced pressure. Dimethyl cadmium, diethyl zinc, and hexamethyldisilathiane are used as the Cd, Zn, and S precursors, respectively. The Cd and Zn are mixed in equimolar ratios while the S was in two-fold excess relative to the Cd and Zn. Two sets of Cd/Zn (5.5 mmol of dimethylcadmium and diethylzinc) and S (22 mmol of hexamethyldisilathiane) samples are each dissolved in 80 mL of trioctylphosphine inside a nitrogen atmosphere glove box. Once the precursor solutions are prepared, the reaction flasks are heated to 155° C. under nitrogen. The precursor solutions are added dropwise the respective reactor solutions over the course of 2 hours at 155° C. using a syringe pump. After the shell growth, the nanocrystals are transferred to a nitrogen atmosphere glovebox and precipitated out of the growth solution by adding a 3:1 mixture of methanol and isopropanol. The resulting precipitates are then dispersed in hexane and precipitated out of solution for a second time by adding a 3:1 mixture of methanol and isopropanol. The isolated core-shell nanocrystals are then dissolved in chloroform and the solutions from the three batches are mixed. (Abs/Emission/FWHM (nm)=610/632/40)

Example 2

Preparation of Optical Component Including Two Different Types of Semiconductor Nanocrystals:

The following film is prepared using optical material including semiconductor nanocrystals (prepared substantially in accordance with the synthesis described in Example 1).

A. Optical Material Including Semiconductor Nanocrystals with a Peak Emission in the Orange Spectral Region:

The semiconductor nanocrystals prepared substantially in accordance with the synthesis described in Example 1A comprise orange-emitting semiconductor nanocrystals dispersed in Fluorobenzene have a peak emission at 588 nm, a FWHM of about 28 nm, a solution quantum yield of 83% and a concentration of 20 mg/ml.

2.7 ml of the 20 mg/ml suspension of the red-emitting nanocrystals is added from a 3 mL syringe to a 20 ml septum capped vial including a magnetic stirrer bar, the system is closed and purged through a syringe needle under vacuum then backfilled with nitrogen. Approximately 90 percent of the solvent is removed from the vial by vacuum stripping. 0.5 ml of RD-12, a low viscosity reactive diluent commercially available from Radcure Corp, 9 Audrey Pl, Fairfield, N.J. 07004-3401 is added. Remaining solvent is removed from the vial by vacuum stripping. 2.0 ml of DR-150 is then added to the vial through a syringe and the mixture is mixed using a Vortex mixer. (DR-150 is a UV-curable acrylic formulation commercially available from Radcure.). The mixture is then placed in an ultrasonic bath for approximately 15 minutes.

0.028 gram $TiO_2$ (Ti-Pure 902+ available from DuPont) is next added to the open vial and the mixture is mixed with a Vortex mixer followed by mixing with an homogenizer.

The vial is then capped and deaerated under vacuum and backfilled with nitrogen.

After mixing, the closed vial is put in an ultrasonic bath for 50 minutes. Care is taken to avoid temperatures over 40° C. while the sample is in the ultrasonic bath.

The sample is stored in the dark until used to make a combined formulation with long wavelength semiconductor and additional matrix material.

B. Optical Material Including Semiconductor Nanocrystals with a Peak Emission in the Red Spectral Region:

The semiconductor nanocrystals prepared substantially in accordance with the synthesis described in Example 1B comprise red-emitting semiconductor nanocrystals dispersed in Chloroform and have a peak emission at 632 nm, a FWHM of about 40 nm, a solution quantum yield of 70% and a concentration of 56.7 mg/ml.

99 ml of the 56.7 mg/ml suspension of the red-emitting nanocrystals is added to a septum capped Erlenmeyer flask including a magnetic stirrer bar, the system is closed and purged through a syringe needle under vacuum then backfilled with nitrogen. Approximately 95 percent of the solvent is removed from the vial by vacuum stripping. 46.6 ml of RD-12, a low viscosity reactive diluent commercially available from Radcure Corp, 9 Audrey Pl, Fairfield, N.J. 07004-3401 is added. Remaining solvent is removed from the vial by vacuum stripping. 187 ml of DR-150 is then added to the vial through a syringe and the mixture is mixed using a Vortex mixer. (DR-150 is a UV-curable acrylic formulation commercially available from Radcure.). The mixture is then placed in an ultrasonic bath for approximately 50 minutes.

Approximately 2.6 gram $TiO_2$ (Ti-Pure 902+ available from DuPont) is next added to the open vial as well as 12.9 grams of Esacure TPO previously ground to reduce particle size in a ball mill machine and the mixture is mixed with a Vortex mixer followed by mixing with an homogenizer.

The vial is then capped and deaerated under vacuum and backfilled with nitrogen.

After mixing, the closed vial is put in an ultrasonic bath for 60 minutes. Care is taken to avoid temperatures over 40° C. while the sample is in the ultrasonic bath. The sample is stored in the dark until used to make a combined formulation with long wavelength semiconductor and additional matrix material.

C. Preparation of Host Material Including Spacer Beads:

0.9 ml of RD-12, a low viscosity reactive diluent commercially available from Radcure Corp, 9 Audrey Pl, Fairfield, N.J. 07004-3401 and 3.8 ml of DR-150, also available from Radcure Corp, is added to a 40 ml vial and the mixture is mixed using a Vortex mixer. The mixture is then placed in an ultrasonic bath for approximately 30 minutes.

Approximately 0.05 gram $TiO_2$ (Ti-Pure 902+ available from DuPont) is next added to the open vial as well as 0.05 grams of GL0179B6/45 space beads available from MO-SCI Specialty Products, Rolla, Mo. 65401 USA, and then mixed using a Vortex mixer.

After mixing, the closed vial is put in an ultrasonic bath for approximately 50 minutes. Care is taken to avoid temperatures over 40° C. while the sample is in the ultrasonic bath. The sample is stored in the dark until used to make a combined formulation with long wavelength semiconductor and additional matrix material.

D. Preparation of Optical Material & Layer Including Red and Orange Emitting Semiconductor Nanocrystals:

An optical material is formed by adding together in a 20 ml vial, 2.52 grams of the host material including spacer beads (prepared substantially in accordance with the procedure described in Example 1C), 0.99 grams of the optical material of Example 1B and 1.00 grams of the optical material of Example 1A. The mixture was stirred using a Vortex mixer followed by sonification in an ultrasonic bath for approximately 50 minutes.

Sample material from the combination vial is dispensed onto a Hexagon shaped flat Borosilicate glass which was previously cleaned using a caustic base bath, acid rinse, deionized water rinse, and a methanol wipe. A second Hexagon plate of the same size also previously cleaned is placed on top of the dispensed sample material and the sandwiched structure is massaged to spread the formulation evenly between the two glass plates. Excess formulation which squeezed out of the structure is wiped off of the outer portion of the glass and the Hexagon sandwich is cured in a 5000-EC UV Light Curing Flood Lamp from DYMAX Corporation system with an H-bulb (30-45 milliWatts/$cm^2$) for 10 seconds. The thickness of the nanocrystal containing layer is approximately 70-79 μm (approximately 360 mg of formulation).

The Hexagon sandwich consisting of two Hexagon shaped flat plates of Borosilicate glass with cured layer of acrylic containing a sample of the optical material prepared substantially as described in Example 2.

Six samples (Samples A-F) were prepared substantially as described in Example 2. Initial CCT, CRI, and External Quantum Efficiency measurements were taken for each sample prior to heating each sample to approximately 50° C. and irradiating the sample to approximately 30 mW/cm2 of 450 nm blue light for the time specified in following Table 1 for each of the samples. CCT, CRI, and EQE measurements were taken after the irradiation time listed for the respective sample. The data is set forth in the following Table 1.

TABLE 1

| | | | | | | |
|---|---|---|---|---|---|---|
| Irradiation at 50° C. @ 30 mW/cm2 | | | | | | |
| Sample Label | Initial CCT (K) | Initial CRI | Initial EQE (%) | Irradiation Time, Hrs | Final CCT (K) | Final CRI | Final EQE (%) |
| A | 2649 | 86.5 | 62 | 1 | 2482 | 87.1 | 78 |
| B | 2664 | 85.6 | — | 13 | 2519 | 87 | 82 |
| C | 2609 | 85.6 | 65 | 2 | 2444 | 87.1 | 77 |
| D | 2641 | 85.4 | 62 | 10 * | 2472 | 87.2 | 80 |
| E | 2659 | 85.2 | 63 | 11 | 2480 | 87.3 | 80 |
| F | 2684 | 84.5 | 60 | 11 | 2446 | 87.3 | 80 |

* 2 hrs 50 C. @ 30 mW/cm2 450 nm, 8 hrs 50 C. @ 15 mW/cm2 450 nm

Example 3

Preparation of Semiconductor Nanocrystals

A. Preparation of Semiconductor Nanocrystals Capable of Emitting Red Light with 3,5-Di-Tert-Butyl-4-Hydroxybenzylphosphonic Acid Synthesis of CdSe Cores: 26.25 mmol cadmium acetate is dissolved in 235.4 mmol of tri-n-octylphosphine at 100° C. in a 250 mL 3-neck round-bottom flask and then dried and degassed for one hour. 465.5 mmol of trioctylphosphine oxide and 59.9 mmol of octadecylphosphonic acid are added to a 0.5 L glass reactor and dried and degassed at 140° C. for one hour. After degassing, the Cd solution is added to the reactor containing the oxide/acid and the mixture is heated to 270° C. under nitrogen. Once the temperature reaches 270° C., 240 mmol of tri-n-butylphosphine is injected into the flask. The temperature of the mixture is then raised to 308° C. where 60 mL of 1.5 M TBP-Se is then rapidly injected. The reaction mixture temperature drops to 284° C. for 30 seconds and then the heating mantle is removed from the reaction flask and the apparatus is cooled via two air guns. The first absorption peak of the nanocrystals is 551 nm. The CdSe cores are precipitated out of the growth solution inside a nitrogen atmosphere glovebox by adding a 3:1 mixture of methanol and isopropanol. The isolated cores are then dissolved in hexane and used to make core-shell materials.

Synthesis of CdSe/CdZnS Core-Shell Nanocrystals: 517.3 mmol of trioctylphosphine oxide and 48.3 mmol of 3,5-di-tert-butyl-4-hydroxybenzylphosphonic acid are loaded into a 0.5 L glass reactor. The mixture is then dried and degassed in the reactor by heating to 120° C. for about an hour. The reactor is then cooled to 70° C. and the hexane solution containing isolated CdSe cores (1.98 mmol Cd content) is added to the reaction mixture. The hexane is removed under reduced pressure. Dimethyl cadmium, diethyl zinc, and hexamethyldisilathiane are used as the Cd, Zn, and S precursors, respectively. The Cd and Zn are mixed in equimolar ratios while the S is in two-fold excess relative to the Cd and Zn. The Cd/Zn (6.13 mmol of dimethylcadmium and diethylzinc) and S (24.53 mmol of hexamethyldisilathiane) samples are each dissolved in 80 mL of trioctylphosphine inside a nitrogen atmosphere glove box. Once the precursor solutions are prepared, the reaction flask is heated to 155° C. under nitrogen. The precursor solutions are added dropwise over the course of 2 hours at 155° C. using a syringe pump. After the shell growth, the nanocrystals are transferred to a nitrogen atmosphere glovebox and precipitated out of the growth solution by adding a 3:1 mixture of methanol and isopropanol. The isolated core-shell nanocrystals are then dissolved in toluene and used to make optical materials. The material specifications are as follows: Abs=591 nm; Emission=603 nm; FWHM=30 nm; QY=85% in Toluene

Example 4

Preparation of Optical Component

A. Optical Material Including Semiconductor Nanocrystals with a Peak Emission in the Red Spectral Region:

The Semiconductor nanocrystals prepared substantially in accordance with the synthesis described in Example 3 comprise red-emitting semiconductor nanocrystals dispersed in Toluene have a (add space) peak emission at 604 nm, a FWHM of about 29 nm, a solution quantum yield of 85% and a concentration of 18 mg/ml.

30.6 ml of the 18 mg/ml suspension of the red-emitting nanocrystals in toluene is added from a 10 mL syringe to a 125 ml septum capped Erlenmeyer flask including a magnetic stirrer bar; the system is closed and purged through a syringe needle under vacuum then backfilled with nitrogen multiple times prior to insertion of the suspension. Approximately 95 percent of the solvent is removed from the Erlenmeyer flask by vacuum stripping while stirring the solution with a magnetic stirrer bar 10 ml of RD-12, a low viscosity reactive diluent commercially available from Radcure Corp. 9 Audrey Pl, Fairfield, N.J. 07004-3401 is added to the Erlenmeyer flask through a syringe Remaining solvent is removed from the Erlenmeyer flask by vacuum stripping while stirring with the magnetic stirrer bar. The Erlenmeyer flask is then placed in an ultrasonic bath for approximately 15 minutes. 40 ml of DR-150 is then added to the Erlenmeyer flask through a syringe while the solution is mixed using the magnetic stir bar. Following the addition, the solution is further mixed using a Vortex mixer. (DR-150 is a UV-curable acrylic formulation commercially available from Radcure.).

0.270 gram $TiO_2$ (Ti-Pure 902+ available from DuPont) is next added to the open Erlenmeyer flask and the mixture is mixed with a Vortex mixer followed by mixing with an homogenizer. Approximately 0.2 grams of Tego 2500 is added dropwise and the solution mixed with a Vortex mixer followed by an additional 45 minutes in the ultrasonic bath. Care is taken to avoid temperatures over 40° C. while the sample is in the ultrasonic bath.

The sample is stored in the dark until used to make an optical component.

B. Optical Component Comprising Glass/Optical Material/Glass

Microscope slides are pre-cleaned using acetone followed by a methanol wipe. Two 80 micron shims are positioned at the corners of one end of the microscope slide and approximately one inch from that end. A small amount of Formulation described in example 4A is placed in the center of the area framed by the shims. A second microscope slide or piece of microscope slide is placed on top of the formulation, positioned such that the edges contact portions of the spacing shims. Small mini binder clips are positioned over the shims to hold the two pieces of glass together, care is taken to avoid shading the formulation with the clips. This structure is cured in a 5000-EC UV Light Curing Flood Lamp from DYMAX Corporation system with an H-bulb (30-45 mW/cm$^2$) for 10 seconds on each side. The clips are removed and the shim stock pulled out of the structure.

The samples are then irradiated by a 450 nm light flux of approximately 25 mW/cm2 at 50 C for the time indicated in Table 2. EQE measurements are made in a 12" integrating sphere using a NIST traceable calibrated light source.

Measurement for un-encapsulated samples are shown in Table 2 as Samples 1 and 2.

C. Optical Component Comprising Glass/Optical Material/Acrylate/Glass

Optical components can also be made sequentially. As an example, the optical material described in example 4A is coated onto a pre-cleaned microscope slide using a Mayer rod 52 yielding approximately 80 um film. This film is cured in an air environment using a 5000-EC UV Light Curing Flood Lamp from DYMAX Corporation system with an H-bulb such that the sample is exposed to energy of approximately 865 mJ/cm2.

Formation of a sealant layer over of the optical material and first substrate is effected by dispensing a sufficient quantity of a UV cure liquid acrylate based material on the cured optical material film such that when a mating glass slide is positioned on top of the structure, the acrylate based liquid covers the majority of the optical material film and preferably beads-up on the edge of the slides. The acrylate based liquid contained between the top microscope slide and the base microscope slide containing the cured optical component film is then cured in an air environment using a 5000-EC UV Light Curing Flood Lamp from DYMAX Corporation system with an H-bulb such that the sample is exposed to energy of approximately 865 mJ/cm2.

External Quantum Efficiency (EQE) is measured on the samples formed in a 12" integrating sphere using a NIST traceable calibrated light source. The samples are then irradiated by a 450 nm light flux of approximately 25 mW/cm2 at 50 C for the time indicated in Table 2. Post irradiation EQE measurements are made using the same technique.

Measurement for encapsulated samples are shown in Table 2 as Samples 3, 4, and 5.

TABLE 2

| Sample | Encapsulant | Initial EQE | Irradiation Time | Post-Irradiation EQE |
|--------|-------------|-------------|------------------|----------------------|
| 1 | None | 67 | 12 hours | 93 |
| 2 | None | 69 | 12 hours | 92 |
| 3 | Acrylate | 65 | 13 hours | 91 |
| 4 | Acrylate | 66 | 13 hours | 92 |
| 5 | Acrylate | 65 | 13 hours | 92 |

Example 5

A: Preparation of Optical Material Ink

Semiconductor nanocrystals having a peak emission at 611 nm, a FWHM of about 33 nm, a solution quantum yield of 71% were used. The semiconductor nanocrystals used were a mixture of semiconductor nanocrystals from 4 separately prepared batches. (Two of the batches were prepared generally following the procedure described in Example 3A; the other two were prepared using the same general procedure, but on a larger scale.) The nanocrystals were dispersed in toluene at a concentration of 20 mg/ml.

367.5 ml of the 20 mg/ml suspension of the red-emitting nanocrystals is contained in a 1 liter round bottom flask, and approximately 90 percent of the solvent is removed from the vial by vacuum stripping. 106.7 ml of RD-12, a low viscosity reactive diluent commercially available from Radcure Corp. 9 Audrey Pl, Fairfield, N.J. 07004-3401 is added. Remaining solvent is removed from the vial by vacuum stripping. The resulting solution is sonicated in an ultrasonic bath for 20 minutes before 427.5 ml of DR-150 is added to the flask and the mixture is sonicated for 20 minutes in an ultrasonic bath. (DR-150 is a UV-curable acrylic formulation commercially available from Radcure.).

4.63 grams of Tego RAD2500 surfactant is added to the open flask, followed by the addition of 1.97 grams $TiO_2$ (Ti-Pure 902+ available from DuPont) and the mixture is mixed with a rotor stator homogenizer (a product of IKA Labor Technik, model Ultra-Turrax T-25).

The flask containing the mixture is then put in an ultrasonic bath for 20 minutes. Care is taken to avoid temperatures over 40° C. while the sample is in the ultrasonic bath.

The sample was stored in the dark until used for the following process.

B. Preparation of Optical Component:

An optical component was prepared by screen-printing approx. a film of optical material ink prepared substantially as described in Example 5A (above) onto each of two separate pre-cleaned glass plates. The ink is printed in air. After the ink is printed, the ink on the two plates is cured by exposure to 2 Dymax Fusion H-bulbs at about 50 milliwatts/cm² for about 30 seconds. The weight of cured ink film on each plate is approx. 0.2269 gram. The curing step is carried out under a blanket of nitrogen. After curing, the plates are returned to air. Next, an amount of optically clear adhesive material is dispensed upon the cured optical material on one of the two plates. The clear adhesive used is a UV curable acrylic urethane product sold by Norland Adhesives called Norland 68 T. (This adhesive material is optically transparent and has oxygen barrier properties). The second plate including cured ink is brought down in a controlled fashion to touch the top of the dispensed adhesive material. The second printed plate is then slowly pushed downwards (with the ink side facing the adhesive) while maintaining parallelism to the bottom glass plate. This compressive force is applied using an electromechanical universal testing machine (ADMET eXpert 7601). The compressive force is substantially uniform across the plate sandwich. The compressive force used is about 60 lbf. The force is held for about one minute before the force is removed. (The printed optical material is now fully encapsulated, being surrounded by the adhesive material on three sides, and by glass on the fourth side.) The compressed plate sandwich is then placed under a UV light source using two D Bulbs at about 140 mW/cm2 for approx. 50 sec. to cure the adhesive. The curing step is carried out in air.

Following the adhesive curing step, resulting optical component is placed on a hot plate at a temperature of 60° C. to uniformly heat the optical component while simultaneously exposing the surfaces of the optical component to uniform light flux of 40-50 mW/cm² and a 450 nm peak wavelength for 6 hours. (Light flux is measured using a OPHIR NOVA laser power meter.)

The solid state EQE was measured for the optical component after completion of the light flux and heat exposure step. The optical component was then placed in bubble wrap and stored in a clear plastic box at room temperature in a room lighted by commercial room fluorescent lighting conditions. After being so stored for about 78 days, the optical component was removed from its storage conditions and solid state measurements were taken. The measurements for the optical component initially and after being stored for about 78 days are set forth below in Table 3:

TABLE 3

| Day # | Solid State EQE | Absorption |
|-------|-----------------|------------|
| 0 | 75% | 69% |
| About 78 | 78% | 69% |

In accordance with another aspect of the present invention, there is provided an optical material obtainable by at least partially encapsulating an optical material comprising quantum confined semiconductor nanoparticles that was previously handled in the presence of oxygen and irradiating the at least partially encapsulated optical material with a light flux for a period of time sufficient to neutralize the charge on at least a portion of the nanoparticles.

In certain embodiments, the optical material is irradiated for a period of time sufficient to increase photoluminescent efficiency of the optical material by at least 10%% of its value prior to irradiation.

In certain embodiments, the optical material is irradiated for a period of time sufficient to increase photoluminescent efficiency of the optical material by at least 30%% of its value prior to irradiation.

In certain embodiments, the optical material is irradiated for a period of time sufficient to increase photoluminescent efficiency of the optical material by at least 40%% of its value prior to irradiation.

In certain embodiments, the optical material is irradiated for a period of time sufficient to increase photoluminescent efficiency of the optical material by at least 50%% of its value prior to irradiation.

In certain embodiments, the optical material is at least partially encapsulated by one or more barrier materials.

In certain embodiments, the optical material that was previously handled in the presence of oxygen is fully encapsulated during the exposure step.

In certain embodiments, the optical material is fully encapsulated by one or more barrier materials.

The method can be carried out in an atmosphere that includes oxygen.

The method can carried out in an inert atmosphere.

The method can be carried out in a nitrogen atmosphere.

In certain embodiments, the light flux comprises a peak wavelength in a range from about 365 nm to about 480 nm.

In certain embodiments, the light flux comprises a peak wavelength in a range from about 365 nm to about 470 nm.

In certain embodiments, the light flux comprises a peak wavelength that is less than the bandgap of the nanoparticles.

In certain embodiments, the light flux is from about 10 to about 100 mW/cm$^2$.

In certain embodiments, the optical material is heated during at least a portion of the time the optical material is exposed to light flux.

In certain embodiments, the optical material is heated during the total time the optical material is exposed to light flux.

Because semiconductor nanocrystals have narrow emission linewidths, are photoluminescent efficient, and emission wavelength tunable with the size and/or composition of the nanocrystals, they are preferred quantum confined semiconductor nanoparticles for use in the various aspects and embodiments of the inventions described herein.

The size and composition of quantum confined semiconductor nanoparticles (including, e.g., semiconductor nanocrystals) useful in the various aspects and embodiments of the inventions can be selected such that semiconductor nanocrystals emit photons at a predetermined wavelength of wavelength band in the far-visible, visible, infra-red or other desired portion of the spectrum. For example, the wavelength can be between 300 and 2,500 nm or greater, such as between 300 and 400 nm, between 400 and 700 nm, between 700 and 1100 nm, between 1100 and 2500 nm, or greater than 2500 nm.

Quantum confined semiconductor nanoparticles (including, e.g., semiconductor nanocrystals) are nanometer-scale inorganic semiconductor nanoparticles. Semiconductor nanocrystals include, for example, inorganic crystallites between about 1 nm and about 1000 nm in diameter, preferably between about 2 nm and about 50 um, more preferably about 1 nm to about 20 nm (such as about 6, 7, 8, 9, 10, 11, 12, 13, 14, 15, 16, 17, 18, 19, or 20 nm).

Semiconductor nanocrystals included in various aspect and embodiments of the inventions most preferably have an average nanocrystal diameter less than about 150 Angstroms (Ø). In certain embodiments, semiconductor nanocrystals having an average nanocrystal diameter in a range from about 12 to about 150 Å can be particularly desirable.

However, depending upon the composition and desired emission wavelength of the semiconductor nanocrystal, the average diameter may be outside of these various preferred size ranges.

The semiconductor forming the nanoparticles and nanocrystals for use in the various aspects and embodiments of the inventions described herein can comprise Group IV elements, Group II-VI compounds, Group II-V compounds, Group III-VI compounds, Group III-V compounds, Group IV-VI compounds, Group I-III-VI compounds, Group II-IV-VI compounds, or Group II-IV-V compounds, for example, CdS, CdO, CdSe, CdTe, ZnS, ZnO, ZnSe, ZnTe, MgTe, GaAs, GaP, GaSb, GaN, HgS, HgO, HgSe, HgTe, InAs, InP, InSb, InN, AlAs, AlP, AlSb, AlS, PbS, PbO, PbSe, Ge, Si, alloys thereof, and/or mixtures thereof, including ternary and quaternary mixtures and/or alloys.

Examples of the shape of the nanoparticles and nanocrystals include sphere, rod, disk, other shape or mixtures thereof.

In certain preferred aspects and embodiments of the inventions, quantum confined semiconductor nanoparticles (including, e.g., semiconductor nanocrystals) include a "core" of one or more first semiconductor materials, which may include an overcoating or "shell" of a second semiconductor material on at least a portion of a surface of the core. In certain embodiments, the shell surrounds the core. A quantum confined semiconductor nanoparticle (including, e.g., semiconductor nanocrystal) core including a shell on at least a portion of a surface of the core is also referred to as a "core/shell" semiconductor nanocrystal.

For example, a quantum confined semiconductor nanoparticle (including, e.g., semiconductor nanocrystal) can include a core comprising a Group IV element or a compound represented by the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof. Examples of materials suitable for use as a core include, but are not limited to, CdS, CdO, CdSe, CdTe, ZnS, ZnO, ZnSe, ZnTe, MgTe, GaAs, GaP, GaSb, GaN, HgS, HgO, HgSe, HgTe, InAs, InP, InSb, InN, AlAs, AlP, AlSb, AlS, PbS, PbO, PbSe, Ge, Si, alloys thereof, and/or mixtures thereof, including ternary and quaternary mixtures and/or alloys. Examples of materials suitable for use as a shell include, but are not limited to, CdS, CdO, CdSe, CdTe, ZnS, ZnO, ZnSe, ZnTe, MgTe, GaAs, GaP, GaSb, GaN, HgS, HgO, HgSe, HgTe, InAs, InP, InSb, InN, AlAs, AlP, AlSb, AlS, PbS, PbO, PbSe, Ge, Si, alloys thereof, and/or mixtures thereof, including ternary and quaternary mixtures and/or alloys.

In certain embodiments, the surrounding "shell" material can have a bandgap greater than the bandgap of the core material and can be chosen so as to have an atomic spacing close to that of the "core" substrate. In another embodiment, the surrounding shell material can have a bandgap less than the bandgap of the core material. In a further embodiment, the shell and core materials can have the same crystal structure. Shell materials are discussed further below. For further examples of core/shell semiconductor structures, see U.S. application Ser. No. 10/638,546, entitled "Semiconductor Nanocrystal Heterostructures", filed 12 Aug. 2003, which is hereby incorporated herein by reference in its entirety.

Quantum confined semiconductor nanoparticles are preferably members of a population of semiconductor nanoparticles having a narrow size distribution. More preferably, the quantum confined semiconductor nanoparticles (including, e.g., semiconductor nanocrystals) comprise a monodisperse or substantially monodisperse population of nanoparticles.

Quantum confined semiconductor nanoparticles show strong quantum confinement effects that can be harnessed in designing bottom-up chemical approaches to create optical properties that are tunable with the size and composition of the nanoparticles.

For example, preparation and manipulation of semiconductor nanocrystals are described in Murray et al. (J. Am. Chem. Soc., 115:8706 (1993)); in the thesis of Christopher Murray, "Synthesis and Characterization of II-VI Quantum Dots and Their Assembly into 3-D Quantum Dot Superlattices", Massachusetts Institute of Technology, September, 1995; and in U.S. patent application Ser. No. 08/969,302 entitled "Highly Luminescent Color-selective Materials" which are hereby incorporated herein by reference in their entireties. Other examples of the preparation and manipulation of semiconductor nanocrystals are described in U.S. Pat. Nos. 6,322,901 and 6,576,291, and U.S. Patent Application No. 60/550,314, each of which is hereby incorporated herein by reference in its entirety.

In various aspects and embodiments of the invention, quantum confined semiconductor nanoparticles (including, but not limited to, semiconductor nanocrystals) optionally have ligands attached thereto.

Quantum confined semiconductor nanoparticles (including, but not limited to, semiconductor nanocrystals) can typically include ligands attached to an outer surface.

Ligands can be derived from a coordinating solvent that can be used to help control the growth process. A coordinating solvent is a compound having a donor lone pair that, for example, has a lone electron pair available to coordinate to a surface of the growing nanocrystal. Solvent coordination can stabilize the growing nanocrystal.

In certain embodiments, the ligands are derived from the coordinating solvent used during the growth process. The surface can be modified by repeated exposure to an excess of a competing coordinating group to form an overlayer. For example, a dispersion of the capped semiconductor nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the semiconductor nanocrystal, including, for example, phosphines, thiols, amines and phosphates. The semiconductor nanocrystal can be exposed to short chain polymers which exhibit an affinity for the surface and which terminate in a moiety having an affinity for a suspension or dispersion medium. Such affinity improves the stability of the suspension and discourages flocculation of the semiconductor nanocrystal. In other embodiments, semiconductor nanocrystals can alternatively be prepared with use of non-coordinating solvent(s).

For example, a coordinating ligand can have the formula:

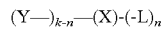

wherein k is 2, 3 or 5, and n is 1, 2, 3, 4 or 5 such that k-n is not less than zero; X is O, S, S=O, SO2, Se, Se=O, N, N=O, P, P=O, As, or As=O; each of Y and L, independently, is aryl, heteroaryl, or a straight or branched C2-12 hydrocarbon chain optionally containing at least one double bond, at least one triple bond, or at least one double bond and one triple bond. The hydrocarbon chain can be optionally substituted with one or more C1-4 alkyl, C2-4 alkenyl, C2-4 alkynyl, C1-4 alkoxy, hydroxyl, halo, amino, nitro, cyano, C3-5 cycloalkyl, 3-5 membered heterocycloalkyl, aryl, heteroaryl, C1-4 alkylcarbonyloxy, C1-4 alkyloxycarbonyl, C1-4 alkylcarbonyl, or formyl. The hydrocarbon chain can also be optionally interrupted by —O—, —S—, —N(Ra)—, —N(Ra)—C(O)—O—, —O—C(O)—N(Ra)—, —N(Ra)—C(O)—N(Rb)—, —O—C(O)—O—, —P(Ra)—, or —P(O)(Ra)—. Each of Ra and Rb, independently, is hydrogen, alkyl, alkenyl, alkynyl, alkoxy, hydroxylalkyl, hydroxyl, or haloalkyl. An aryl group is a substituted or unsubstituted cyclic aromatic group. Examples include phenyl, benzyl, naphthyl, tolyl, anthracyl, nitrophenyl, or halophenyl. A heteroaryl group is an aryl group with one or more heteroatoms in the ring, for instance furyl, pyridyl, pyrrolyl, phenanthryl.

Examples of additional ligands include alkyl phosphines, alkyl phosphine oxides, alkyl phosphonic acids, or alkyl phosphinic acids, pyridines, furans, and amines. More specific examples include, but are not limited to, pyridine, tri-n-octyl phosphine (TOP), tri-n-octyl phosphine oxide (TOPO) and tris-hydroxylpropylphosphine (tHPP). Technical grade TOPO can be used.

A suitable coordinating ligand can be purchased commercially or prepared by ordinary synthetic organic techniques, for example, as described in J. March, Advanced Organic Chemistry, which is incorporated herein by reference in its entirety.

See also U.S. patent application Ser. No. 10/641,292 entitled "Stabilized Semiconductor Nanocrystals", filed 15 Aug. 2003, which is hereby incorporated herein by reference in its entirety.

When a quantum confined semiconductor nanoparticle (including, but not limited to, a semiconductor nanocrystal) achieves an excited state (or in other words, an exciton is located on the nanocrystal), emission can occur at an emission wavelength. The emission has a frequency that corresponds to the band gap of the quantum confined semiconductor material. The band gap is a function of the size of the nanoparticle. Quantum confined semiconductor nanoparticles having small diameters can have properties intermediate between molecular and bulk forms of matter. For example, quantum confined semiconductor nanoparticles having small diameters can exhibit quantum confinement of both the electron and hole in all three dimensions, which leads to an increase in the effective band gap of the material with decreasing crystallite size. Consequently, for example, both the optical absorption and emission of semiconductor nanocrystals shift to the blue, or to higher energies, as the size of the crystallites decreases.

The emission from a quantum confined semiconductor nanoparticle can be a narrow Gaussian emission band that can be tuned through the complete wavelength range of the ultraviolet, visible, or infra-red regions of the spectrum by varying the size of the quantum confined semiconductor nanoparticle, the composition of the quantum confined semiconductor nanoparticle, or both. For example, CdSe can be tuned in the visible region and InAs can be tuned in the infra-red region. The narrow size distribution of a population of quantum confined semiconductor nanoparticles can result in emission of light in a narrow spectral range. The population can be monodisperse preferably exhibits less than a 15% rms (root-mean-square) deviation in diameter of the quantum confined semiconductor nanoparticle s, more preferably less than 10%, most preferably less than 5%. Spectral emissions in a narrow range of no greater than about 75 nm, preferably 60 nm, more preferably 40 nm, and most preferably 30 nm full width at half max (FWHM) for quantum confined semiconductor nanoparticle s that emit in the visible can be observed. IR-emitting quantum confined semiconductor nanoparticle s can have a FWHM of no greater than 150 nm, or no greater than 100 nm. Expressed in terms of the energy of the emission, the emission can have a FWHM of no greater than 0.05 eV, or no greater than 0.03 eV. The breadth of the emission decreases as the dispersity of quantum confined semiconductor nanoparticle diameters decreases. A narrow FWHM of semiconductor nanocrystals can result in saturated color emission. A monodisperse population of semiconductor nanocrystals will emit light spanning a narrow range of wavelengths.

For example, semiconductor nanocrystals can have high emission quantum efficiencies such as greater than 10%, 20%, 30%, 40%, 50%, 60%, 70%, 80%, or 90%.

Transmission electron microscopy (TEM) can provide information about the size, shape, and distribution of the semiconductor nanocrystal population. Powder X-ray diffraction (XRD) patterns can provide the most complete information regarding the type and quality of the crystal structure of the semiconductor nanocrystals. Estimates of size are also possible since particle diameter is inversely related, via the X-ray coherence length, to the peak width. For example, the diameter of the semiconductor nanocrystal can be measured directly by transmission electron microscopy or estimated from X-ray diffraction data using, for example, the Scherrer equation. It also can be estimated from the UV/Vis absorption spectrum.

Quantum confined semiconductor nanoparticles are preferably handled in a controlled (oxygen-free and moisture-free) environment, preventing the quenching of luminescent efficiency during the fabrication process.

An optical material comprising quantum confined semiconductor nanoparticles can be dispersed in a liquid medium and are therefore compatible with thin-film deposition techniques such as spin-casting, drop-casting, and dip coating.

In certain preferred embodiments, an optical material for use in various aspects and embodiments in accordance with the invention can be prepared, for example, from an ink comprising quantum confined semiconductor nanoparticles and a liquid vehicle, wherein the liquid vehicle comprises one or more functional groups that are capable of being polymerized (e.g., cross-linked) to form a host material. In certain embodiments, the functional units can be cross-linked by UV treatment. In certain embodiments, the functional units can be cross-linked by thermal treatment. In certain embodiments, the functional units can be cross-linked by other cross-linking technique readily ascertainable by a person of ordinary skill in a relevant art. In certain embodiments, the optical material including one or more functional groups that are capable of being cross-linked can be the liquid vehicle itself. See also U.S. Application No. 60/946,090 of Linton, et al., for "Methods For Depositing Nanomaterial, Methods For Fabricating A Device, Methods For Fabricating An Array Of Devices And Compositions", filed 25 Jun. 2007, and U.S. Application No. 60/949,306 of Linton, et al., for "Compositions, Methods For Depositing Nanomaterial, Methods For Fabricating A Device, And Methods For Fabricating An Array Of Devices", filed 12 Jul. 2007, the disclosures of each of which are hereby incorporated herein by reference. Optionally, the ink further includes scatterers and/or other additives.

An ink can be deposited onto a surface of a substrate by printing, screen-printing, spin-coating, gravure techniques, inkjet printing, roll printing, etc. The ink can be deposited in a predetermined arrangement. For example, the ink can be deposited in a patterned or unpatterned arrangement. For additional information that may be useful to deposit an ink onto a substrate, see for example, International Patent Application No. PCT/US2007/014711, entitled "Methods For Depositing Nanomaterial, Methods For Fabricating A Device, And Methods For Fabricating An Array Of Devices", of Seth A. Coe-Sullivan, filed 25 Jun. 2007, the foregoing patent application being hereby incorporated herein by reference.

Due to the positioning of the optical material comprising quantum confined semiconductor nanoparticles in features or layers resulting from these deposition techniques, not all of the surfaces of the nanoparticles may be available to absorb and emit light.

In certain embodiments, an optical material comprising quantum confined semiconductor nanoparticles can be deposited on a surface using contact printing. See, for example, A. Kumar and G. Whitesides, *Applied Physics Letters*, 63, 2002-2004, (1993); and V. Santhanam and R. P. Andres, *Nano Letters*, 4, 41-44, (2004), each of which is incorporated by reference in its entirety. See also U.S. patent application Ser. No. 11/253,612, filed 21 Oct. 2005, entitled "Method And System For Transferring A Patterned Material", of Coe-Sullivan et al. and U.S. patent application Ser. No. 11/253,595, filed 21 Oct. 2005, entitled "Light Emitting Device Including Semiconductor Nanocrystals," of Coe-Sullivan, each of which is incorporated herein by reference in its entirety.

Optical materials and optical components described herein may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, a sign, lamps and various solid state lighting devices.

This technique can be use for depositing a various thicknesses of optical materials comprising quantum confined semiconductor nanoparticles. In certain embodiments the thickness is selected to achieve the desired % absorption thereby. Most preferably, the quantum confined semiconductor nanoparticles do not absorb any, or absorb only negligible amounts of, the re-emitted photons.

In certain embodiments, methods for applying a material (e.g., an optical material) to a predefined region on a substrate may be desirable. The predefined region is a region on the substrate where the material is selectively applied. In certain embodiments wherein the optical component includes two or more different types of quantum confined semiconductor nanoparticles to compensate for more than one spectral deficiency of a light source, different types of quantum confined semiconductor nanoparticle can optionally be included in two or more different optical materials, and each of the different optical materials can be applied to different regions of the substrate and/or as separate layers over the substrate. The material and substrate can be chosen such that the material remains substantially entirely within the predetermined area. By selecting a predefined region that forms a pattern, material can be applied to the substrate such that the material forms a pattern. The pattern can be a regular pattern (such as an array, or a series of lines), or an irregular pattern. Once a pattern of material is formed on the substrate, the substrate can have a region including the material (the predefined region) and a region substantially free of material. In some circumstances, the material forms a monolayer on the substrate. The predefined region can be a discontinuous region. In other words, when the material is applied to the predefined region of the substrate, locations including the material can be separated by other locations that are substantially free of the material.

An optical material comprising quantum confined semiconductor nanoparticles can alternatively be deposited by solution based processing techniques, phase-separation, spin casting, inkjet printing, silk-screening, and other liquid film techniques available for forming patterns on a surface.

Alternatively, quantum confined semiconductor nanoparticles can be dispersed in a light-transmissive host material (e.g., a polymer, a resin, a silica glass, or a silica gel, etc., which is preferably at least partially light-transmissive, and more preferably transparent, to the light emitted by the quantum confined semiconductor nanoparticles and in which quantum confined semiconductor nanoparticles can be dispersed) that is deposited as a full or partial layer or in a patterned arrangement by any of the above-listed or other known techniques. Suitable materials include many inexpensive and commonly available materials, such as polystyrene, epoxy, polyimides, and silica glass. After application to the surface, such material may contain a dispersion of quantum confined semiconductor nanoparticles where the nanoparticles have been size selected so as to produce light of a given color. Other configurations of quantum confined semiconductor nanoparticles disposed in a material, such as, for example, a two-dimensional layer on a substrate with a polymer overcoating are also contemplated.

U.S. patent application Ser. No. 12/283,609 of Seth Coe-Sullivan et al. for "Compositions, Optical Component, System Including An Optical Components, Devices, And Other Products", filed 12 Sep. 2008 is hereby incorporated herein by reference in its entirety.

Other materials, techniques, methods, applications, and information that may be useful with the present invention are described in: U.S. Application No. 61/162,293, filed 21 Mar. 2009, U.S. Application No. 61/173,375 filed 28 Apr. 2009, U.S. Application No. 61/175,430 filed 4 May 2009, U.S. Patent Application No. 61/175,456, filed 4 May 2009, U.S. Patent Application No. 61/234,179, filed 14 Aug. 2009, International Patent Application No. PCT/US2009/002789, filed 6 May 2009; and U.S. patent application Ser. No. 12/283,609, filed 12 Sep. 2008, U.S. patent application Ser. No. 12/283,609 of Seth Coe-Sullivan et al. for "Compositions, Optical Component, System Including An Optical Components, Devices, And Other Products", filed 12 Sep. 2008, International Application No. PCT/US2008/10651, of Breen, et al., for "Functionalized Nanoparticles And Method", filed 12 Sep. 2008, International Application No. PCT/US2009/002796 of Seth Coe-Sullivan et al. for "Optical Components, Systems Including an Optical Component, And Devices", filed 6 May 2009, and U.S. Patent Application No. 61/252,656 of Breen for "Method For Preparing Quantum Dots", filed 17 Oct. 2009 U.S. Application No. 60/946,090 of Linton, et al., for "Methods For Depositing Nanomaterial, Methods For Fabricating A Device, Methods For Fabricating An Array Of Devices And Compositions", filed 25 Jun. 2007, and U.S. Application No. 60/949,306 of Linton, et al., for "Compositions, Methods For Depositing Nanomaterial, Methods For Fabricating A Device, And Methods For Fabricating An Array Of Devices", filed 12 Jul. 2007. Each of the foregoing is hereby incorporated by reference herein in its entirety. Each of the foregoing is hereby incorporated by reference herein in its entirety.

As used herein, "top", "bottom", "over", and "under" are relative positional terms, based upon a location from a reference point. More particularly, "top" means farthest away from a reference point, while "bottom" means closest to the reference point. Where, e.g., a layer is described as disposed or deposited "over" a component or substrate, the layer is disposed farther away from the component or substrate. There may be other layers between the layer and component or substrate. As used herein, "cover" is also a relative position term, based upon a location from a reference point. For example, where a first material is described as covering a second material, the first material is disposed over, but not necessarily in contact with the second material.

As used herein, the singular forms "a", "an" and "the" include plural unless the context clearly dictates otherwise. Thus, for example, reference to an emissive material includes reference to one or more of such materials.

Applicants specifically incorporate the entire contents of all cited references in this disclosure. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

As used herein, "top", "bottom", "over", and "under" are relative positional terms, based upon a location from a reference point. More particularly, "top" means farthest away from a reference point, while "bottom" means closest to the reference point. Where, e.g., a layer is described as disposed or deposited "over" a component or substrate, the layer is disposed farther away from the component or substrate. There may be other layers between the layer and component or substrate. As used herein, "cover" is also a relative position term, based upon a location from a reference point. For example, where a first material is described as covering a second material, the first material is disposed over, but not necessarily in contact with the second material.

As used herein, the singular forms "a", "an" and "the" include plural unless the context clearly dictates otherwise. Thus, for example, reference to an emissive material includes reference to one or more of such materials.

Applicants specifically incorporate the entire contents of all cited references in this disclosure. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

The invention claimed is:

1. A method for treating an optical component including an optical material comprising quantum confined semiconductor nanoparticles, wherein the optical material is at least partially encapsulated, the method comprising irradiating the optical component including the optical material comprising the quantum confined semiconductor nanoparticles with a light flux for a period of time sufficient to neutralize the charge on at least one quantum confined semiconductor nanoparticle of the quantum confined semiconductor nanoparticles, wherein the light flux is from about 10 to about 100 mW/cm$^2$.

2. A method in accordance with claim 1 wherein the optical material is irradiated for a period of time sufficient to increase photoluminescent efficiency of the optical material by at least 10% of its value prior to irradiation.

3. A method in accordance with claim 1 wherein the optical material is irradiated for a period of time sufficient to increase photoluminescent efficiency of the optical material by at least 30% of its value prior to irradiation.

4. A method in accordance with claim 1 wherein the optical component is irradiated in an atmosphere that includes oxygen.

5. A method in accordance with claim 1 wherein the optical component is irradiated in an inert atmosphere.

6. A method in accordance with claim 1 wherein the optical material is at least partially encapsulated by including the optical material on a glass substrate and including a coating over at least a portion of a surface of the optical material opposite the glass substrate.

7. A method in accordance with claim 1 wherein the optical material is at least partially encapsulated by sandwiching the optical material between glass substrates.

8. A method in accordance with claim 1 wherein the optical material is fully encapsulated.

9. A method in accordance with claim 1 wherein the optical material is encapsulated between opposing substrates that are sealed together by a seal, wherein each of the substrates and seal comprises a material that is substantially oxygen impervious.

10. A method in accordance with claim 1 wherein the optical material is encapsulated between opposing substrates that are sealed together by a seal, wherein each of the substrates and seal comprises a material that is substantially oxygen and water impervious.

11. A method in accordance with claim 1 wherein the optical material is disposed on a glass substrate and the optical material is covered by a coating comprising a barrier material.

12. A method in accordance with claim 11 wherein the barrier material comprises a material that is substantially oxygen and water impervious.

13. A method in accordance with claim 11 wherein the barrier comprises a material that is substantially oxygen impervious.

14. A method in accordance with claim 1 wherein the optical material is irradiated while at a temperature in a range from about 25° to about 80° C.

15. A method in accordance with claim 1 wherein the optical material further comprises a host material in which the quantum confined semiconductor nanoparticles are dispersed.

16. A method in accordance with claim 8 wherein the optical material is encapsulated between glass plates that are sealed together by a barrier material.

17. A method in accordance with claim 8 wherein the optical material is encapsulated between glass plates that are sealed together by a glass-to-glass perimeter or edge seal.

18. A method in accordance with claim 8 wherein the optical material is encapsulated between glass plates that are sealed together by a glass-to-metal perimeter or edge seal.

19. A method in accordance with claim 1 wherein substantially all of the quantum confined semiconductor nanoparticles are charge neutral.

20. A method in accordance with claim 1 wherein the optical material is irradiated by a light source including emission in a range from about 365 nm to about 480 nm.

* * * * *